(12) United States Patent
Chua et al.

(10) Patent No.: US 7,000,315 B2
(45) Date of Patent: Feb. 21, 2006

(54) METHOD OF MAKING PHOTOLITHOGRAPHICALLY-PATTERNED OUT-OF-PLANE COIL STRUCTURES

(75) Inventors: Christopher L. Chua, San Jose, CA (US); Francesco Lemmi, Rome (IT); Koenraad F. Van Schuylenbergh, Mountain View, CA (US); Jeng Ping Lu, Mountain View, CA (US); David K. Fork, Los Altos, CA (US); Eric Peeters, Fremont, CA (US); Decai Sun, Sunnyvale, CA (US); Donald L. Smith, Bolinas, CA (US); Linda T. Romano, Sunnyvale, CA (US)

(73) Assignee: Xerox Corporation, Stamford, CT (US)

( * ) Notice: Subject to any disclaimer, the term of this patent is extended or adjusted under 35 U.S.C. 154(b) by 117 days.

(21) Appl. No.: 10/387,203

(22) Filed: Mar. 11, 2003

(65) Prior Publication Data
US 2003/0179064 A1  Sep. 25, 2003

Related U.S. Application Data

(62) Division of application No. 09/573,815, filed on May 17, 2000, now Pat. No. 6,856,225.

(51) Int. Cl.
*H01R 43/16* (2006.01)
(52) U.S. Cl. .............. 29/874; 29/877; 29/876; 29/842; 29/882; 430/322
(58) Field of Classification Search .......... 430/322, 430/320; 29/842, 843, 874, 884, 885; 439/66, 439/74, 81; 336/200, 232, 233; 200/245, 200/275
See application file for complete search history.

(56) References Cited

U.S. PATENT DOCUMENTS

| | | | |
|---|---|---|---|
| 5,613,861 A | 3/1997 | Smith et al. | 439/81 |
| 5,848,685 A | 12/1998 | Smith et al. | 200/275 |
| 5,914,218 A | 6/1999 | Smith et al. | 430/320 |

(Continued)

FOREIGN PATENT DOCUMENTS

EP  0 687 907  12/1995

(Continued)

OTHER PUBLICATIONS

U.S. Appl. No. 09/573,815, filed May 17, 2000, Chua, et al.

(Continued)

*Primary Examiner*—Minh Trinh
(74) *Attorney, Agent, or Firm*—Jeannette M. Walder

(57) ABSTRACT

An out-of-plane micro-structure which can be used for on-chip integration of high-Q inductors and transformers places the magnetic field direction parallel to the substrate plane without requiring high aspect ratio processing. The photolithographically patterned coil structure includes an elastic member having an intrinsic stress profile. The intrinsic stress profile biases a free portion away from the substrate forming a loop winding. An anchor portion remains fixed to the substrate. The free portion end becomes a second anchor portion which may be connected to the substrate via soldering or plating. A series of individual coil structures can be joined via their anchor portions to form inductors and transformers.

11 Claims, 33 Drawing Sheets

U.S. PATENT DOCUMENTS

| | | | |
|---|---|---|---|
| 5,944,537 A | 8/1999 | Smith et al. | 439/81 |
| 6,147,582 A | 11/2000 | Goldsmith et al. | 336/200 |
| 6,183,659 B1 | 2/2001 | Murayama et al. | 252/62.62 |
| 6,245,444 B1 | 6/2001 | Marcus et al. | 428/616 |
| 6,392,524 B1 * | 5/2002 | Biegelsen et al. | 336/220 |
| 6,534,249 B1 * | 3/2003 | Fork et al. | 430/322 |
| 6,582,989 B1 * | 6/2003 | Biegelsen et al. | 438/106 |
| 6,640,432 B1 * | 11/2003 | Mathieu et al. | 29/482 |

FOREIGN PATENT DOCUMENTS

| | | |
|---|---|---|
| WO | WO 99/18445 | 4/1999 |

OTHER PUBLICATIONS

Chukwunenye Stanley Nnebe, A Mechanically-raised Micromachined Variable Inductor Coil, www.ee.cornell.edu/MENG/Abstracts/tien.htm, May 19, 1999, pp. 1-3

Young-Jun Kim and Mark G. Allen, Micr Inductro for High Frequency Applications, www.ece.gatech.edu/research/labs/msmsma/Magnetic/hifinductor.htm, 1995, pp. 1-2.

Lucent Free Standing Inductor, MRP ME Analyst, Nov. 9, 1999.

* cited by examiner

FIG. 10
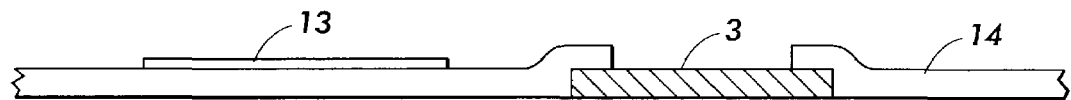
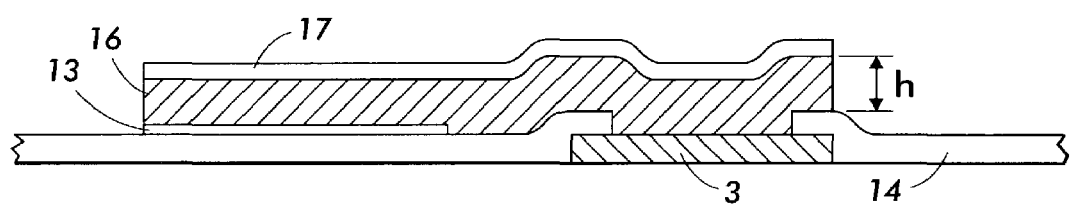
FIG. 11
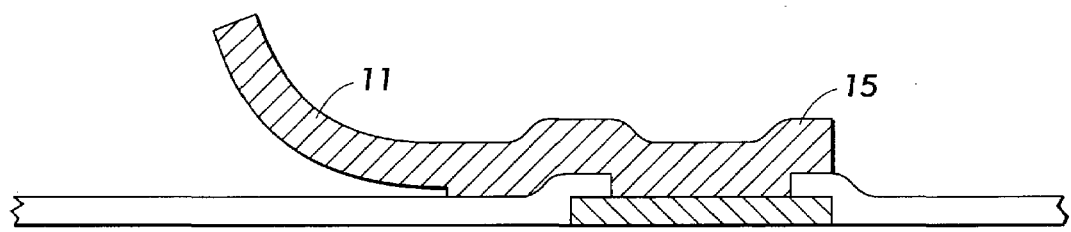
FIG. 12
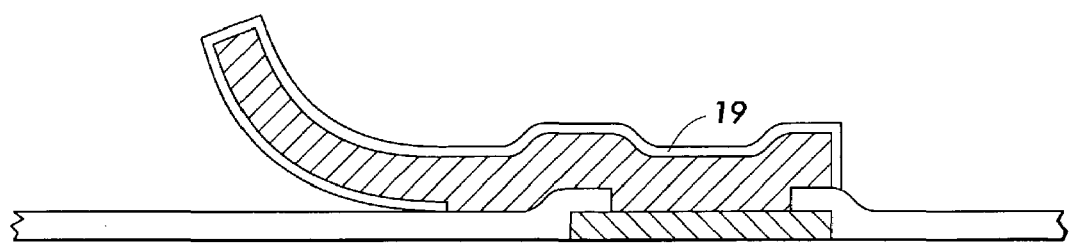
FIG. 13

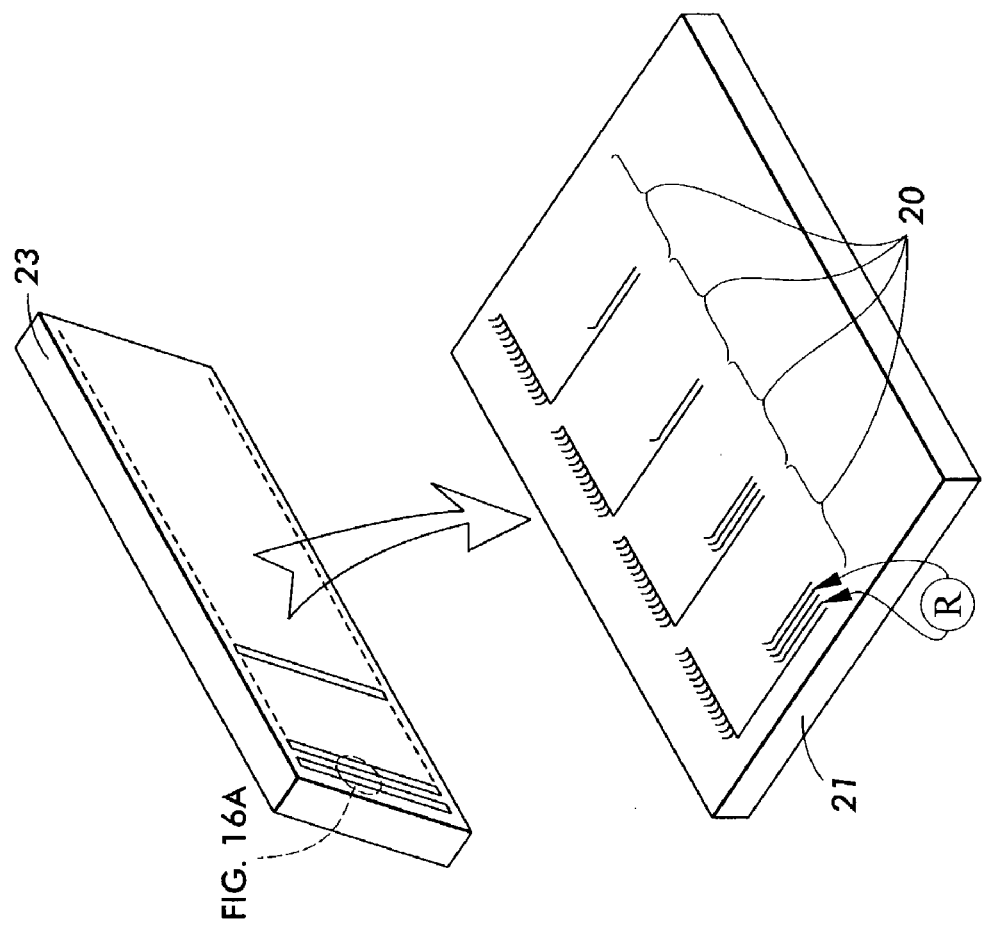
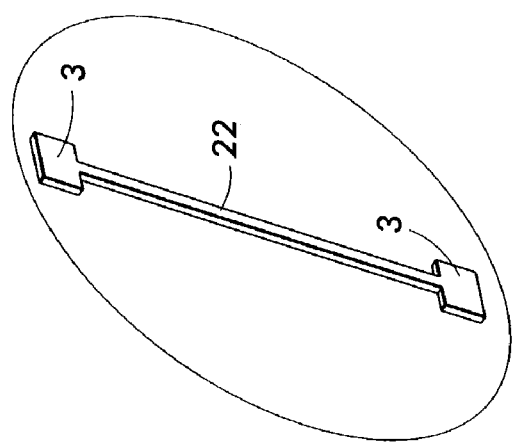
FIG. 16A
FIG. 16B

FIG. 28
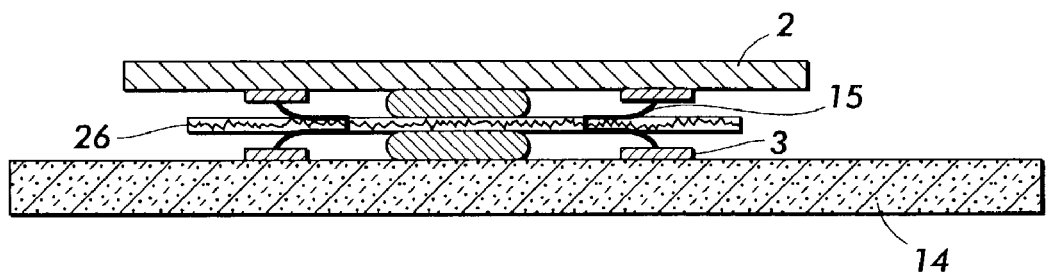
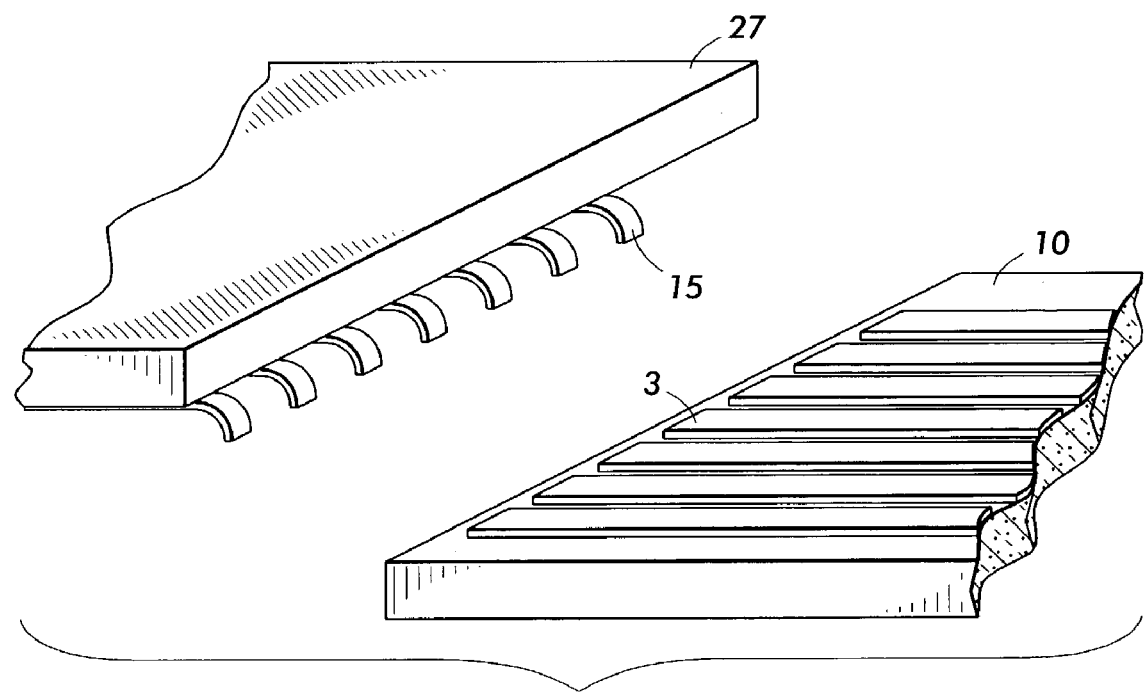
FIG. 29

FIG. 31A
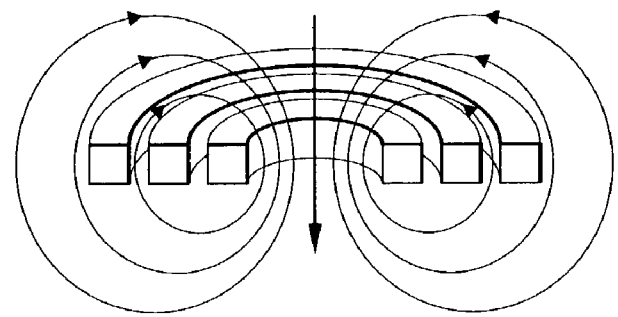
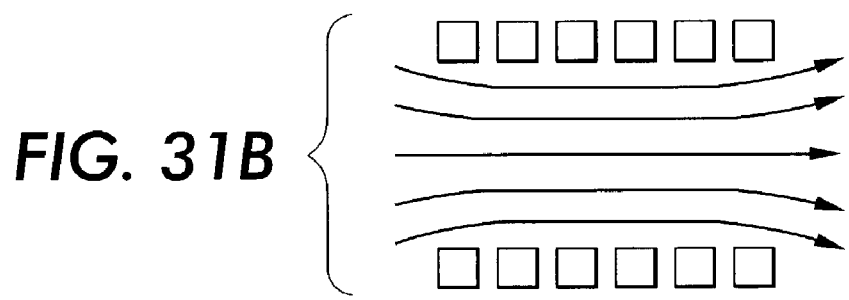
FIG. 31B
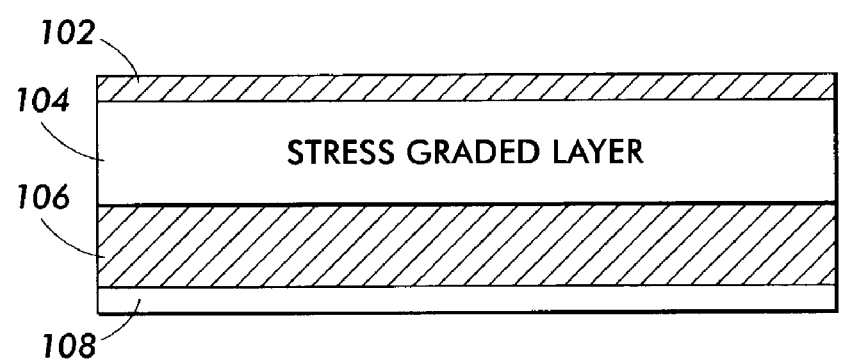
FIG. 32

FIG. 33
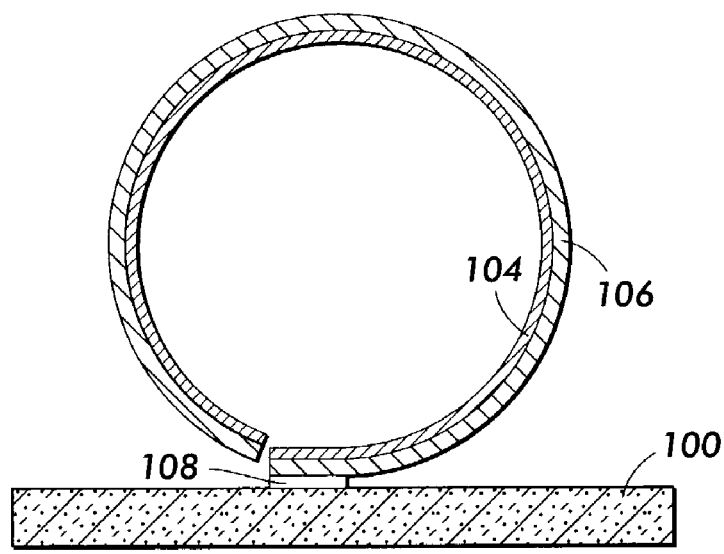
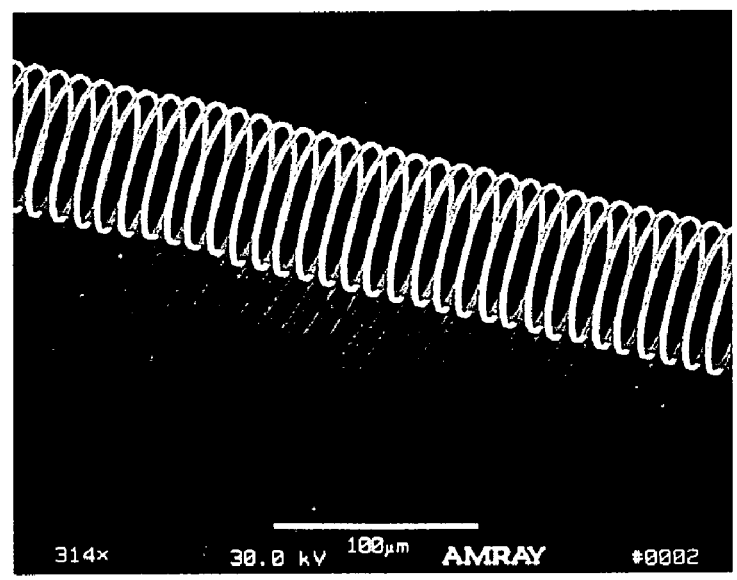
FIG. 34

FIG. 43
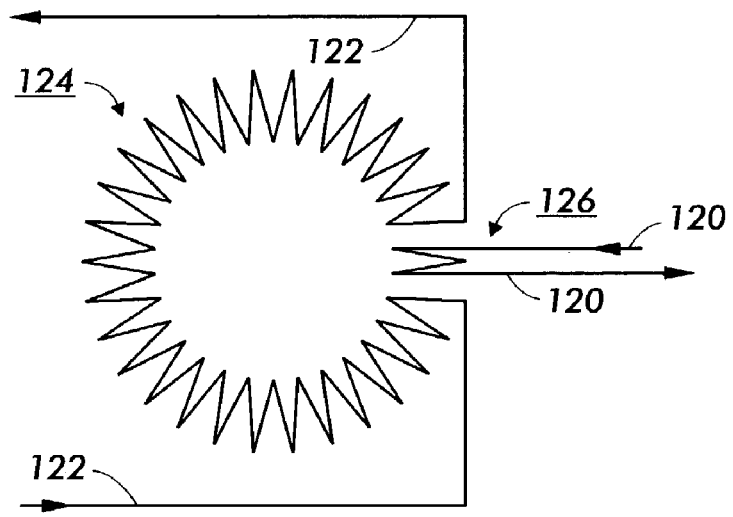
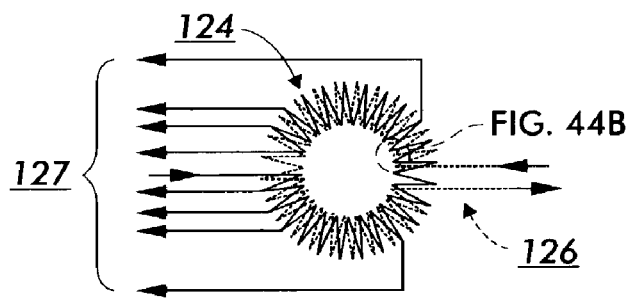
FIG. 44A
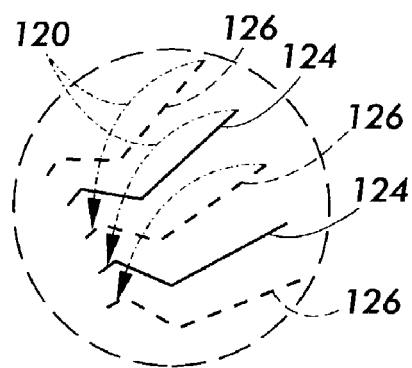
FIG. 44B

FIG. 48
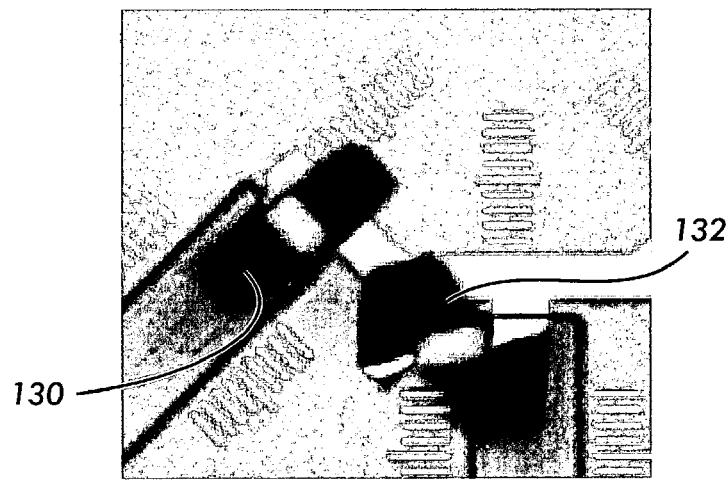
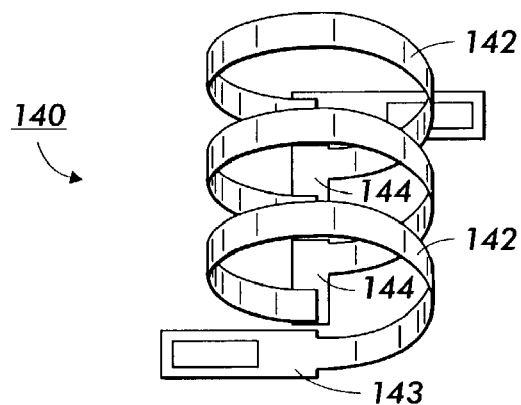
FIG. 49
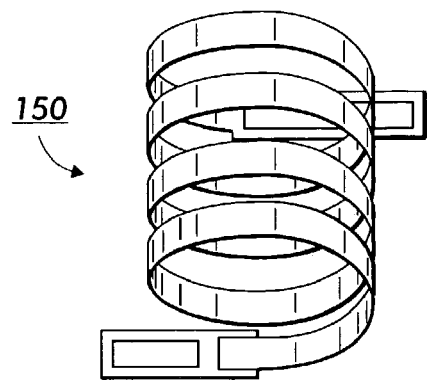
FIG. 50

FIG. 51
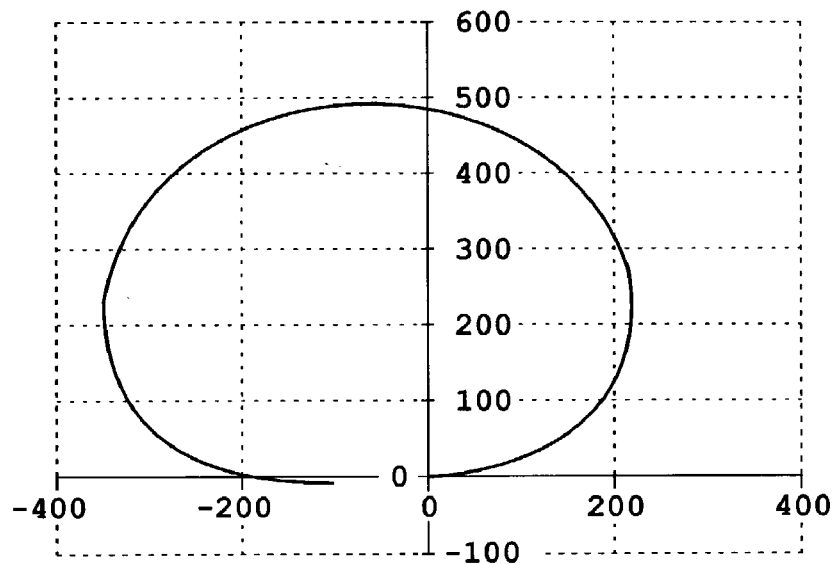
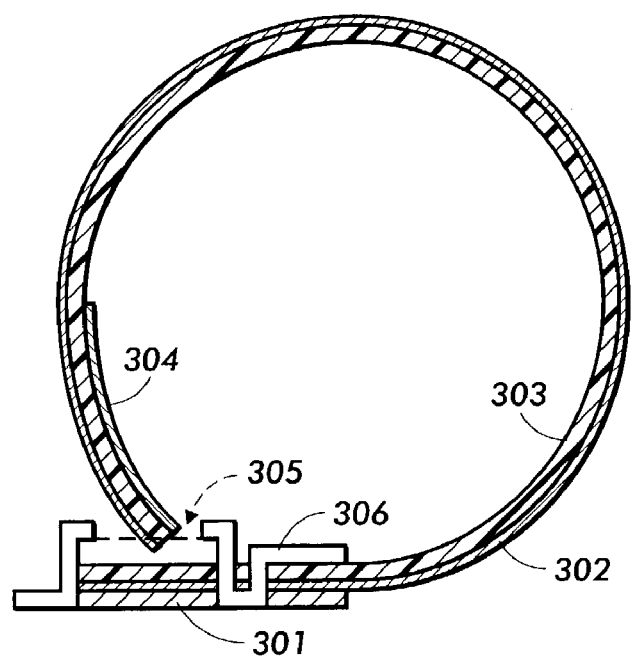
FIG. 52

FIG. 53
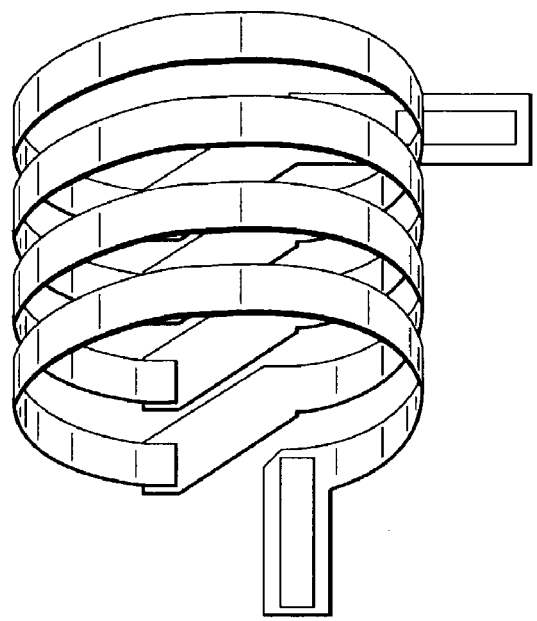
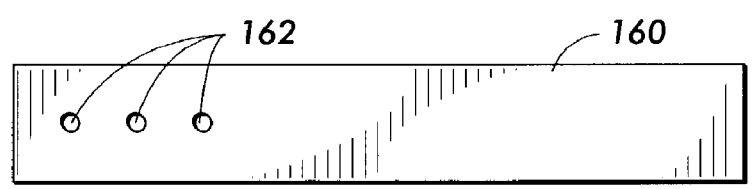
FIG. 54A
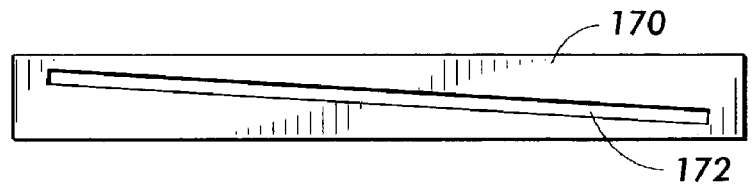
FIG. 54B

FIG. 55
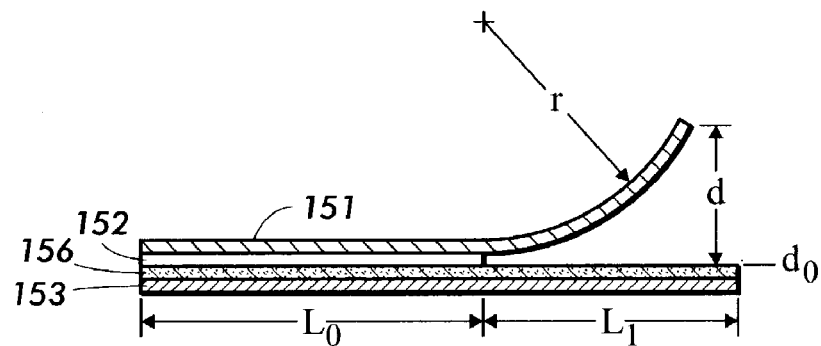
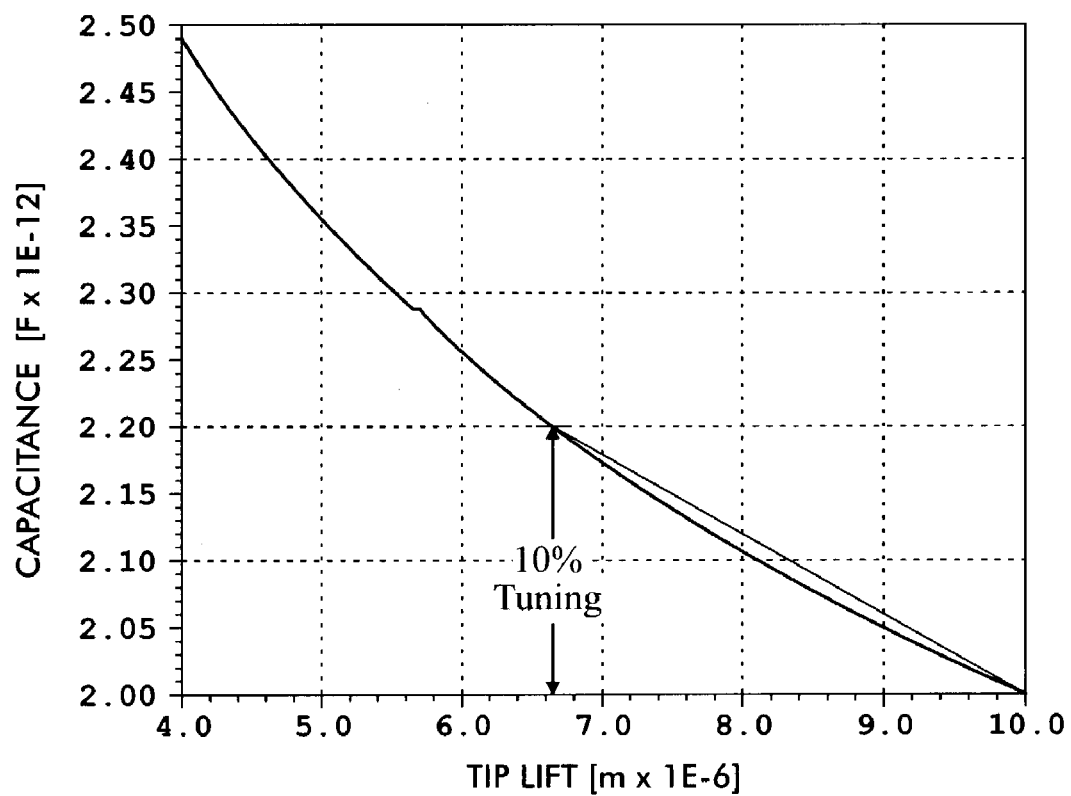
FIG. 56

*FIG. 58*
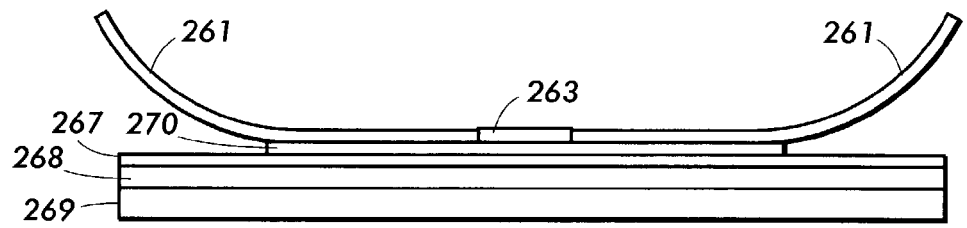
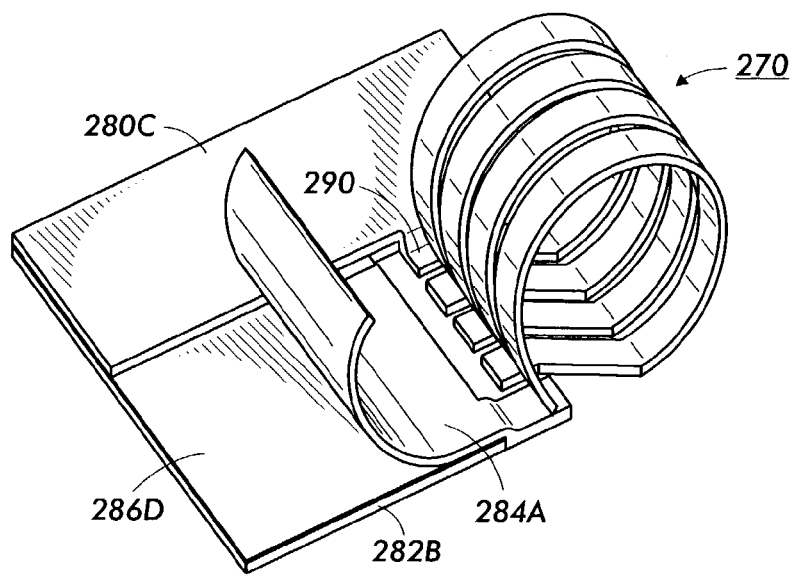
*FIG. 59*
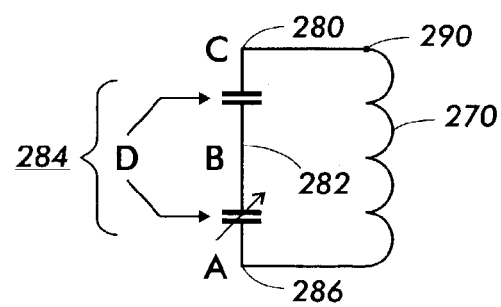
*FIG. 60*

METHOD OF MAKING PHOTOLITHOGRAPHICALLY-PATTERNED OUT-OF-PLANE COIL STRUCTURES

CROSS REFERENCE TO RELATED APPLICATION

This application is a division of U.S. application Ser. No. 09/573,815 filed May 17, 2000, now U.S. Pat. No. 6,856,225, the contents of which are incorporated herein by reference.

BACKGROUND OF THE INVENTION

1. Field of the Invention

This invention generally relates to photolithographically-patterned, out-of-plane coil structures for use in integrated circuits, circuit boards and other devices.

2. Description of Related Art

Standard bonding techniques for electrically connecting integrated circuits, or chips, to a circuit board or other device include wire bonding, tab bonding, and solder-bump flip-chip bonding. FIG. 1 shows a contact pad 3 formed on a chip 2 wire bonded to a corresponding contact pad 3 formed on a substrate 1. The contact pads 3 are electrically connected, or bonded, by a wire 4. Since the chip 2 typically has tens or even hundreds of the contact pads 3, wire bonding each contact pad 3 on the chip 2 to the corresponding contact pad 3 on the substrate 1 is labor intensive, expensive and slow. Further, the contact pads 3 must be large enough to accommodate both the wire 4 and the accuracy of the wire bonding device used to create the wire bond. Therefore, the contact pads 3 are made larger than otherwise necessary to compensate for the size limitations of wire 4 and the wire bonding device.

FIG. 2 shows the contact pad 3 formed on the chip 2 tab bonded to the corresponding contact pad 3 on the substrate 1. A flexible substrate 5 having conductive lines formed on its lower surface is forced against the contact pads 3. A layer of anisotropic adhesive (not shown) is placed between the contact pads 3 and the flexible substrate 5. When the flexible substrate 5 is pressed against the contact pads 3, the anisotropic adhesive and the conductive lines formed on the flexible substrate 5 cooperate to complete the electrical connection between the contact pads 3. Like wire bonding, tab bonding suffers from yield loss and high cost. Irregularities in the heights of the contact pad 3 result in non-uniform contacting force pressing the flexible substrate 5 against the contact pads 3. The non-uniform contacting force means that some contact pads 3 will not be properly bonded to the flexible substrate 5.

Another conventional method for bonding the contact pads 3 formed on the chip 2 to the contact pads 3 formed on the substrate 1 or to some other device is solder-bump flip-chip bonding. FIG. 3 shows the chip 2 inverted with the contact pads 3 facing toward the substrate 1. The name "flip-chip" derives from the inversion of the chip 2, since the chip 2 is "flipped over" with the contacts pads 3 facing the substrate 1, in contrast to both tab bonding and wire bonding where the contact pads 3 on the chip 2 face away from the substrate 1. In standard flip-chip bonding, solder bumps 6 are formed on the contact pads 3 on the substrate 1. The electrical connection between the corresponding contact pads 3 is completed by pressing the contact pads 3 on the chip 2 against the solder bumps 6.

Flip-chip bonding is an improvement over both wire bonding and tab bonding. The relatively soft solder bumps 6 tend to permanently deform when the chip 2 is pressed down against the solder bumps 6. This deformation of the solder bumps 6 compensates for some irregularity in the heights of the contact pads 3 and any uneven contacting pressure forcing the chip 2 against the solder bumps 6.

However, flip-chip bonding does suffer from both mechanical and thermal variations in the solder bumps 6. If the solder bumps 6 are not uniform in height or if the substrate 1 is warped, contact between the contact pads 3 and the solder bumps 6 can be broken. Also, if the contacting pressure forcing the chip 2 down on the solder bumps 6 is uneven, contact between some contact pads 3 and corresponding solder bumps 6 can fail.

FIG. 4 shows a standard technique for establishing a temporary electrical contact between two devices. A probe card 7 having a plurality of probe needles 8 contacts the contact pads 3 by physically pressing the probe needles 8 against the contact pads 3. The physical contact between the probe needles 8 and the contact pads 3 creates an electrical connection between the probe needles 8 and the lines 9 formed on the substrate 1.

The probe cards 7 are generally used to create only temporary contacts between the probe needles 8 and the contact pads 3, so that the device 10 can be tested, interrogated or otherwise communicated with. The device 10 can be a matrix of display electrodes which are part of an active-matrix liquid crystal display. Testing of the devices 10, such as liquid crystal display electrode matrices, is more thoroughly described in an application JAO 34053 to the same inventor, co-filed and co-pending herewith and herein incorporated by reference.

The probe cards 7 have many more applications than only for testing liquid crystal displays. Any device 10 having numerous and relatively small contact pads 3, similar to those found on the chip 2, can be tested using the probe card 7. However, standard techniques for producing the probe card 7 are time consuming and labor-intensive. Each probe card 7 must be custom-made for the particular device 10 to be tested. Typically, the probe needles 8 are manually formed on the probe card 7. Because the probe cards 7 are custom-made and relatively expensive, the probe cards 7 are not typically made to contact all of the contact pads 3 on the device 10 at one time. Therefore, only portions of the device 10 can be communicated with, tested or interrogated at any one time, requiring the probe card 7 be moved to allow communication, testing or interrogation of the entire device 10.

The probe cards 7 are also used to test the chips 2 while the chips 2 are still part of a single-crystal silicon wafer. One such probe card 7 is formed by photolithographic pattern plated processing, as disclosed in *Probing at Die Level*, Corwith, Advanced Packaging, February, 1995, pp. 26–28. Photolithographic pattern plated processing produces probe cards 7 which have essentially the same design as the standard probe card 7. However, this new type of processing appears to automate the method for producing probe needles 8, thus avoiding manually forming the probe needles 8. Also, this article discloses a probe card 7 which is bent at the end nearest the probe needles 8, as shown in FIG. 5. The bend in the probe card 7 allows the probe needles 8 to contact the contact pad 3 at an angle. As the probe card 7 pushes the probe needles 8 into the contact pads 3, a mechanical scrubbing action occurs which allows the probe needles 8 to break through the oxide formed-on the top surface of the contact pad 3.

All of the standard probe cards 7, however, are limited to testing contact pads 3 which are arranged in a linear array.

Also, the standard probe cards 7 are sensitive to variations in the height of the contact pads 3 on the substrate 1, irregularities or warping of the substrate 1, and temperature variations.

The integration of small inductors on silicon substrates has been the subject of intense worldwide research for more than 15 years. This effort is driven by the desire to integrate coils on silicon and gallium arsenide integrated circuits (ICs). The structures proposed so far, however, have been variations of devices in which, due to technological constraints, the coil windings have almost always been implemented as spirals parallel to the underlying substrate.

These in-plane architectures have two major drawbacks. When made on a substrate that is slightly conducting such as silicon, the coil magnetic fields induce eddy currents in the underlying substrate. These currents cause resistive dissipation that contributes to the coil losses. The second problem arises when the coil is operated at high frequencies, where skin and proximity effects force the coil current to flow along the outer surfaces of the conductor. The "skin depth" is about 2 to 3 $\mu$m for typical conductors at frequencies of interest for wireless communication, for example, 900 MHz, 1.9 GHz and 2.4 GHz. The AC resistance of the coil conductor becomes appreciably higher than its DC resistance because the cross section of the conductor is not fully used.

FIG. 31 shows the current distribution in in-plane coils operated at high frequencies. Darker shading in the coil indicates a higher current density. The disk-shaped coil shown in FIG. 31a has a current distribution that is concentrated at the outer edges of the winding wire. Therefore, widening the conductor simply increases the unused portion of the conductor and does not reduce the AC resistance. This situation may be compared to the typical discrete component, out-of-plane coil of FIG. 31b, where the AC resistance can be reduced by simply making the conductors wider.

Solutions have been proposed and tried in the past to address the drawbacks associated with in-plane inductor coils. Eddy currents can be reduced, for example, by etching away the substrate underneath the coil. However, this approach is not practical as it sacrifices structural integrity and destroys existing electronic circuitry on the silicon substrate. To reduce the AC resistance of the device in FIG. 31a, the conductor can be made very thick using micromachining techniques such as LIGA (see A. Rogner et al., "The LIGA technique—what are the new opportunities," *J. Micromech. Microeng.*, vol.2, pp. 133–140, 1992.). However, processing high aspect ratio structures is difficult and expensive.

Various out-of-plane techniques have been suggested. For example, Chukwunenye Stanley Nnebe, in "A Mechanically-raised Micromachined Variable Inductor Coil" (www.ee.cornell.edu/MENG/Abstracts/tien.htm) describes an out-of plane variable inductor structure. The structure is initially gold-metallized strips of polysilicon on the surface plane of the substrate, which are then raised and fastened via a hinging system to form a triangular geometry upon contact. After the setup of the coil is completed, the slider representing the magnetic core can then be activated through an impact system that is controlled by four comb-drive resonators (two comb-drive resonators for each direction of motion). The insertion of the magnetic core through the coils would influence the magnetic flux developed around the coils and, thus, would vary the inductance accordingly. The tuning range of the inductor is set by this effect, and reliable data may be obtained by carefully controlling the four resonators that actuate the slider causing it to move a finite distance through the coils. Such a technique is fairly complicated to micromachine and requires additional components on valuable chip real estate.

Robert Marcus et al. in International PCT Application number WO 99/18445 filed Oct. 2, 1998, titled Michromachined element and Method of Fabrication thereof discloses a coiled structure that is formed by depositing two layers of material having different coefficients of thermal expansion on a sacrificial layer, removing the sacrificial layer, then heating the cantilevered structure until it curls partially upon itself. Coil closure is achieved by patterning a tethered end to the tip of the cantilevered structure.

When the sacrificial layer is removed and the cantilever heated, the cantilever curls on itself, causing the tethered end to twist. Such a method and structure, however, is impractical for creating arrays of densely packed, integrated microinductors and other structures on silicon substrates.

Low-loss inductors that can be integrated on chip are most desirable in wireless communication devices such as cellular phones, pagers, GPS receivers, warehouse management RF identification tags, wireless computer LANs, personal digital assistants, and satellite telecommunication. Small portable devices, in particular, require the lowest possible power consumption for extended battery life and a maximal circuit integration to reduce device size and PC board complexity. The quest for low-loss inductors is driven by a fundamental trade-off between power consumption on one hand and the need for low-loss circuit passives (i.e. inductors and capacitors) on the other. Lowering the transistor bias in radio circuits reduces the power dissipation, but also significantly degrades amplifier gains, oscillator stability and filter selectivity. Using low-loss passives is the only viable technique to overcome this problem. Low-loss capacitors in the 0.1 to 100 pF range are routinely integrated on chip nowadays. However, state-of-the-art integrated coil architectures are still too lossy to be of use in integrated RF designs. All present RF chipsets, therefore, are limited to using discrete inductors that form a real estate bottleneck in today's increasingly miniaturized applications.

Modern wireless designs typically run in the lower GHz bands. The standard frequencies for cellular phones are 900 MHz, 1.8 GHz, 1.9 GHz and 2.4 GHZ, while 900 MHz is the frequency of choice for digital cordless phones. The 410–430 MHz, 870 MHz and 900–930 MHz bands are used for wireless RS-232, computer LANs and RF identification. At these 100 MHz to GHz frequencies, the passives of choice are typically, for inductors, 1 to 30 nH and, for capacitors, 1 to 30 pF. The intermediate frequencies in superheterodyne receivers are 40 to 350 MHz which calls for passives in the order of 100 to 1000 nH and 10 to 100 pF. Although high quality on-chip capacitors ranging from 0.1 pF to 100 pF are commonplace, integrated inductors and integrated variable capacitors that meet the low-loss requirements are currently not available.

Variable capacitors (varicaps) that can be integrated on chip are also in great demand. The benchmark architecture for contemporary wireless transceivers is still the superheterodyne architecture, which uses both inductors and varicaps. Variable capacitors are essential components of superheterodyne circuits used in many wireless devices. Superheterodyne circuits containing both inductors and capacitors currently cannot be integrated on chip in commercial devices, and so present a bottleneck to device miniaturization. The missing links in implementing full superheterodyne wireless architectures on a chip are inductors with quality factors of at least 30 to 50, variable capacitors (varicaps) with a tuning range of 10% and quality factors of 30 to 50, and oscillators with quality factors of 10,000 or more. The process technology for making the capacitors should be compatible with the process for making the inductors.

Present wireless devices use discrete off-chip components to implement superheterodyne circuits. The very high Q oscillator is usually a crystal oscillator. There are also numerous Voltage Controlled Oscillators (VCOs), each of which uses at least one discrete inductor and one discrete varicap. Because of these discrete components VCOs occupy a large portion of many RF circuit area. Being able to integrate entire VCOs on chip requires a new type of varicap as well as inductor.

There is a need for a micromachined coil structure which is easy to manufacture and does not use a lot of chip real estate. There is a need for low loss coil structures and variable capacitors that can be integrated on conductive substrates, such as silicon. There is also a need for an integrated coil structure in which the windings have lower resistance. There is a need for a method of manufacturing a coil structure in which closing the turns of the coil electrically produces a viable electrical structure. There is a need for a manufacturable technique that results in a closed coil structure suitable for high-Q integrated passive inductor elements. There is a need for a manufacturing technique which would enable the integration of both on chip inductors and varicaps.

SUMMARY OF THE INVENTION

Accordingly, this invention provides a spring contact which exhibits the speed and ease of solder-bump flip-chip bonding while eliminating the need to create uniform solder bumps or uniform contacting pressure. This invention further provides a spring contact which has elastic properties enabling the spring contact to maintain physical contact with a contact pad despite variations in contact pad heights, contacting pressure or thermal variations. This invention also provides an elastic spring contact having a stress gradient formed in the spring contact, which causes the spring contact to bend away from the substrate and thus provide compliant contact with a contact pad. This invention further provides a probe card and a method for producing the probe card having spring contacts in place of standard probe needles.

The spring contacts of this invention are formed of a thin metal strip which is in part fixed to a substrate and electrically connected to a contact pad on the substrate. The free portion of the metal strip not fixed to the substrate bends up and away from the substrate.

When the contact pad on a device is brought into pressing contact with the free portion of the metal strip, the free portion deforms and provides compliant contact with the contact pad. Since the metal strip is electrically conductive or coated with a conductive material, the contact pad on the substrate is electrically connected to the contact pad on the device via the spring contact.

Another embodiment of the invention overcomes the drawbacks of planar coil structures in that the coil structures of the invention place the coil axis parallel, rather than perpendicular, to the substrate plane. A coil structure, according to the invention, includes a substrate and an elastic member having an intrinsic stress profile. The elastic member includes a first anchor portion fixed to the substrate, a loop winding and a second anchor portion connected to the substrate. The second anchor portion and the loop winding are initially fixed to the substrate, but are released from the substrate to become separated from the substrate. An intrinsic stress profile in the elastic member biases the second anchor portion away from the substrate forming the loop winding and causing the second anchor portion to contact the substrate. The resulting coil structure is out-of-the plane of the substrate. The loop winding may also include a plurality of turns.

Various techniques may be used to position the second anchor portion away from the takeoff point of the elastic member, either tangentially or axially. If the second anchor point is positioned tangentially from the takeoff point, the loop winding is generally in the shape of a circle, i.e., the second anchor portion contacts the substrate in the same vertical plane as the first anchor portion. Various techniques may be used to position the second anchor portion tangentially from the takeoff point. For example, a mechanical stop can be fixed to the substrate at the desired location. Alternatively, the radius of curvature of the elastic member may be varied, such as by adding a load layer uniformly across the width of a portion of the elastic member or by patterning one or more openings or perforations uniformly across the width of a portion of the elastic member.

If the second anchor portion is positioned axially from the takeoff point or first anchor portion, the loop winding is generally in the shape of a helix. Several techniques may be used to form the loop winding in a helix. For example, a uniform stress anisotropy may be introduced into the elastic member, which causes a helical deformation in the released layer. Alternatively, the radius of curvature can be varied in the elastic member to introduce a helical deformation. This can be accomplished by varying the intrinsic stress profile in the elastic member as a function of position. A helical winding may also be formed by causing the resulting loop winding to have two (or more) different radii of curvature. This may be accomplished, for example, by forming one or more openings asymmetrically in the elastic member prior to release or by forming a load layer at an angle on a portion of the elastic member (upon release, the weight of the load layer causes the loop winding to be axially offset).

Various techniques can be used to connect the second anchor portion to the substrate. For example, the second anchor portion can be soldered or plated to the substrate. Each anchor portion can be attached to a metal contact pad attached to the substrate, for providing electrical connectivity to other elements in a circuit. Preferably the elastic member is formed of a conductive material. Alternatively, a layer of a conductive metal, such as gold or silver, may be plated on an inner surface, an outer surface, or both surfaces.

This novel structure allows, for the first time, the integration of submillimeter-size high-Q inductors on both insulating and conductive substrates. When fabricated on a conductive substrate like silicon, the coil structure produces much fewer magnetic flux lines that intercept the substrate than present in-plane micro-coils, which then results in fewer eddy currents induced in the substrate and lower coil losses. Furthermore, the coil structures may be used as inductors, which are compatible with toroidal architectures that confine magnetic fields exceedingly well. This property enables multiple micro-coils to be packed densely without coupling with each other. At high operating frequencies, skin and proximity effects increase the coil resistance. Unlike in-plane micro-coils, the out-of-plane coil structures can be easily designed for low resistance operation without complicated high aspect-ratio processing. The out-of-plane coil structures are also compatible with numerous micro-coil embodiments such as center-tapped inductors and transformers for a wide range of applications.

A method for forming a coil structure, according to the invention, includes depositing a layer of an elastic material on a substrate, the elastic material having an intrinsic stress profile. The layer of elastic material is then photolithographically patterned into an elastic member. A portion of the substrate under the patterned structure is under-cut etched to release a free portion of the elastic member from the substrate, an anchor portion of the elastic member remaining fixed to the substrate. The intrinsic stress profile in the elastic member biases the free portion of the elastic member away from the substrate, forming a loop winding and causing the free end to contact a point on the substrate. This free end can then be connected to the substrate by, for example soldering or plating.

During the removal of sacrificial layers from the substrate, the intrinsic stress bends metal containing strips into the turns of an inductor coil. Fabrication of micro-coil structures requires control over the coil geometry, in particular the coil radius, and, if a stress anisotropy is present, the helical pitch of the coil elements as well. If, for example, the loop has a constant radius r of curvature, and the length of the released portion is $2\pi r$, the free end will naturally return to the take-off point of the loop. By placing a mechanical stop at a position away from the take off point, the free end can be positioned and anchored. Magnetic structures can be created with such loops by connecting the loops on the substrate with contact pads which extend from the take off point of one loop to the contact point of an adjoining loop, producing a spiral. In another embodiment, the free end of the spring is offset axially and/or transversely with respect to the takeoff point in order to provide for contact to adjacent loop pads. Mechanical and electrical contact is made permanent, for example, by soldering, conductive adhesive, thermal compressive bonding or plating.

One aspect of the invention recognizes that it is possible to create helical coiled structures of controlled diameter and pitch by exploiting stress anisotropy engineered into the deposited metal. The helical twisting provides the useful feature that the free end of the spring is shifted longitudinally (or axially) from the take-off point. In principle, this allows formation of a continuous inductor consisting of multiple turns without interruption of the spring metal. It also allows segments of more than one turn to be joined in order to produce an inductor. These structures reduce the number of coil-closing interconnects, and thereby minimize the impact of interconnects on inductor quality factor.

Another aspect of this invention relates to producing a turn of a coil endowed with the property of non-constant radius. This allows the free end of the elastic member to contact a point other than the take-off point of the loop, either tangentially from the takeoff point or offset axially from the takeoff point. Once a point away from the take-off point is contacted electrically, the un-lifted metal can be used to run a trace to any other point of an electrical circuit, including to another loop of an inductor. Several ways of varying the radius of curvature are described, including varying the intrinsic stress profile along the elastic member, depositing a load layer along a portion of the elastic member, and photolithographically patterning perforations in the elastic member.

A new type of high-Q variable capacitor includes a substrate, a first electrically conductive layer fixed to the substrate, a dielectric layer fixed to a portion of the electrically conductive layer, and a second electrically conductive layer having an anchor portion and a free portion. The anchor portion is fixed to the dielectric layer and the free portion is initially fixed to the dielectric layer, but is released from the dielectric layer to become separated from the dielectric layer. An inherent stress profile in the second electrically conductive layer biases the free portion away from the dielectric layer. When a bias voltage is applied between the first electrically conductive layer and the second electrically conductive layer, electrostatic forces in the free portion bend the free portion towards the first electrically conductive layer, thereby increasing the capacitance of the capacitor.

The manufacturing techniques of the invention can be used to create a tunable LC combination employing a coil structure and variable capacitor to provide full superheterodyne wireless architectures on a silicon chip.

BRIEF DESCRIPTION OF THE DRAWINGS

This invention will be described in relation to the following drawings, in which reference numerals refer to like elements and wherein:

FIGS. 10–13 show the steps for one method of forming a spring contact;

FIG. 16 is a device for testing the contact resistance of a plurality of spring contact pairs;

FIG. 28 is a chip electrically bonded to a substrate by way of an intermediate wafer having a plurality of spring contacts;

FIG. 29 is a probe card having a plurality of spring contacts used for testing an electronic device;

FIGS. 31a and 31b are cross-sections illustrating the current distribution at high frequencies in a disk shaped coil and a solenoid, respectively;

FIG. 32 is a cross-section of a stack of stress graded film deposited above a release layer;

FIG. 33 illustrates a constant radius coil structure;

FIG. 34 is an SEM micrograph of a series of constant radius loops;

FIG. 43 illustrates a simple air core transformer;

FIG. 44 illustrates an air-core transformer with intertwined primary and secondary windings;

FIG. 48 illustrates different helical pitch from varied spring orientation;

FIG. 49 illustrates a multi-turn coil formed of single helical turn coils;

FIG. 50 illustrates a helically joined multi-turn loop;

FIG. 51 is a plot of a three segmented spring with three different radii;

FIG. 52 illustrates a coil closed using a load member;

FIG. 53 illustrates transversely joined single turn loops;

FIGS. 54a and 54b illustrate two structures having a varying radius of curvature;

FIG. 55 is a cross-section of a varicap according to the invention;

FIG. 56 is a graph of varicap capacitance versus spring lift; and

FIG. 58 is a cross-section along line A—A of FIG. 57;

FIG. 59 is a perspective of a tunable LC circuit;

FIG. 60 is a circuit diagram for the circuit of FIG. 59.

DETAILED DESCRIPTION OF THE PREFERRED EMBODIMENTS

Figure 1:
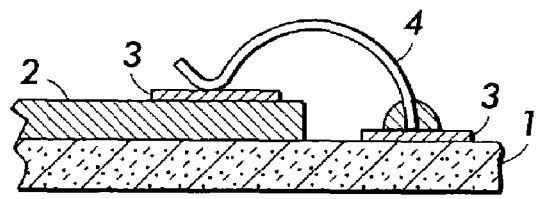
FIG. 1 shows a chip wire bonded to a substrate.
Figure 2:
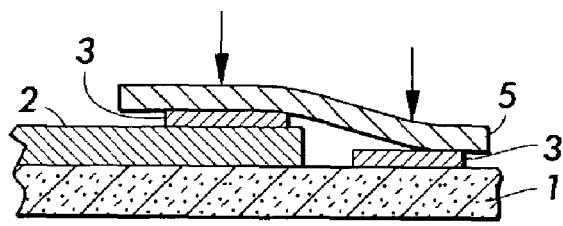
FIG. 2 shows the chip tab bonded to the substrate.
Figure 3:
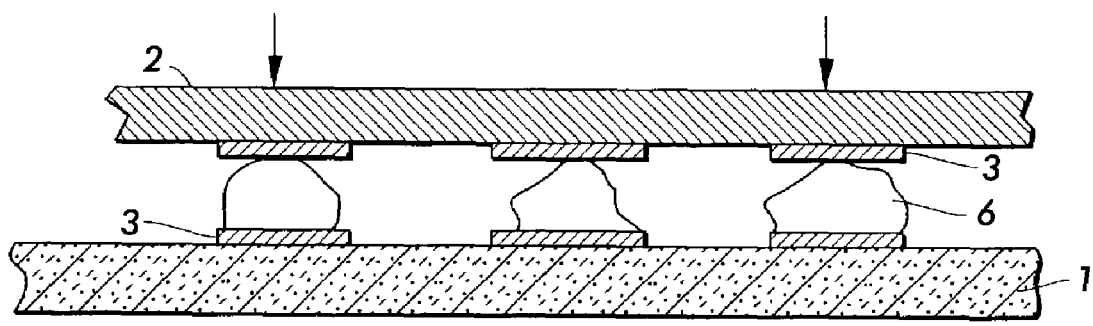
FIG. 3 shows the chip solder-bump flip-chip bonded to the substrate.
Figure 4A:
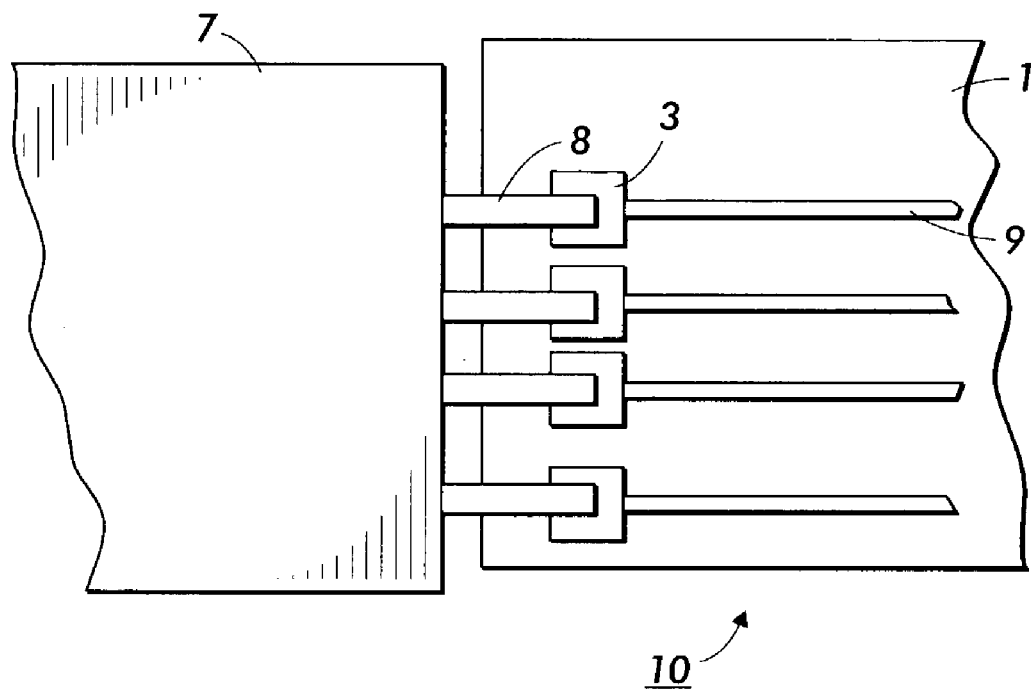
FIG. 4 shows a probe card contacting an electronic device.
Figure 4B:
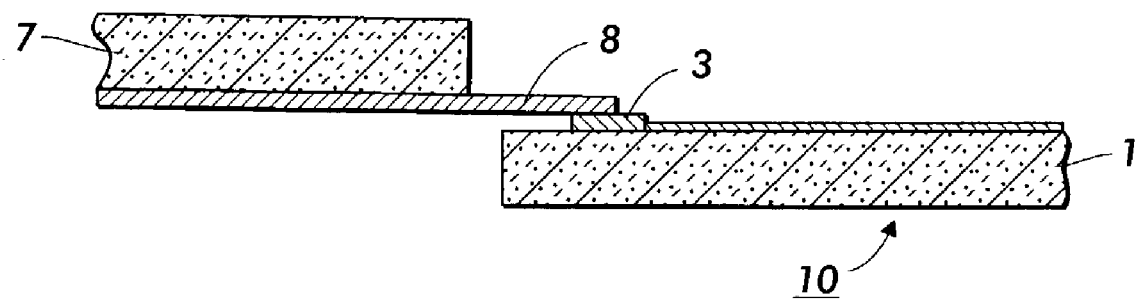
Figure 5:
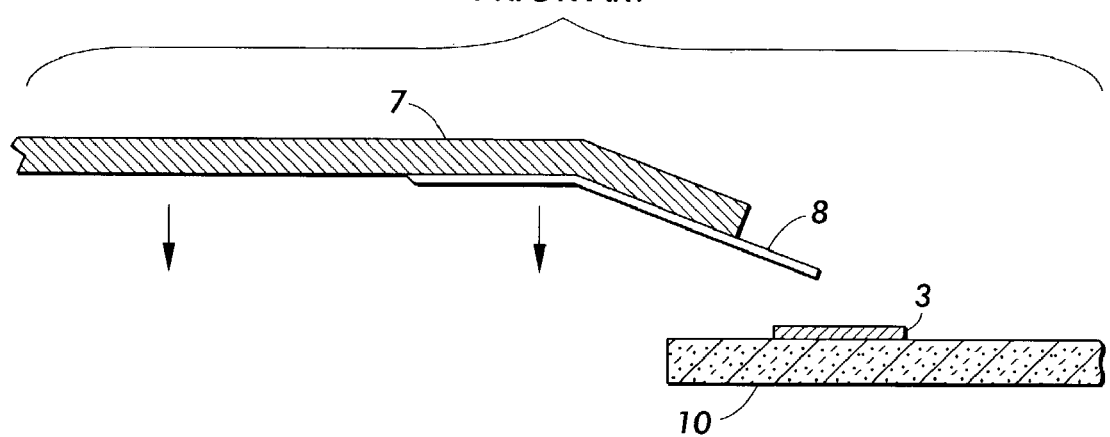
FIG. 5 shows a probe card having an angled probe needle.
Figure 6:
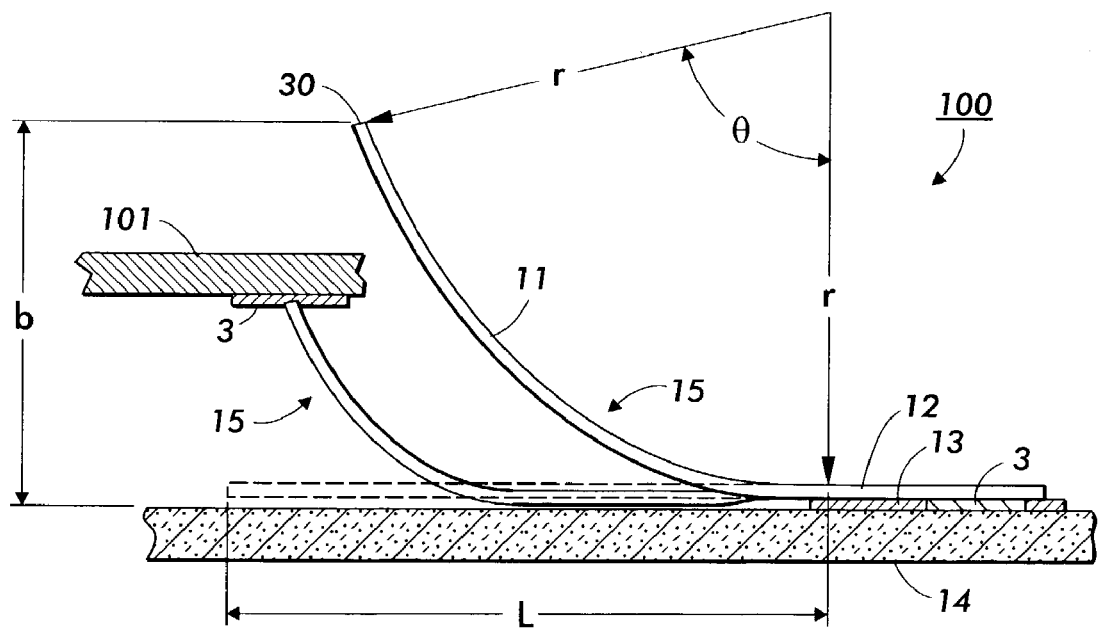
FIG. 6 is a spring contact in an undeformed free state and another spring contact deformed when contacting a contact pad.

FIG. 6 shows a side view of a bonding structure 100 having a plurality of spring contacts 15. Each spring contact 15 comprises a free portion 11 and an anchor portion 12 fixed to an underlayer or release layer 13 and electrically connected to a contact pad 3. Each spring contact 15 is made of an extremely elastic material, such as a chrome-molybdenum alloy or a nickel-zirconium alloy. Preferably, the spring contacts 15 are formed of an elastic conductive material, although they can be formed of a non-conductive or semi-conductive material if they are coated or plated with a conductor material. More preferably, the spring contacts 15 are formed of a nickel-zirconium alloy having 1% zirconium. Zirconium is added to the alloy to improve the elastic properties of the alloy while not greatly affecting the conductivity of the alloy. When the elastic material is not conductive, it is coated on at least one side with a conductive material, such as a metal or metal alloy.

The contact pad 3 is the terminal end of a communication line which electrically communicates with an electronic device formed on the substrate 14, such as a transistor, a display electrode, or other electrical device. The contact pad 3 is typically made of aluminum, but can be made of any conductive material. The release layer 13 is made of silicon nitride, Si, Ti or other etchable material. However, the release layer 13 is not necessary and can be eliminated. The release layer 13 and the contact pad 3 are formed on or over a substrate 14, which is formed of a material, such as oxidized silicon or glass or a printed circuit board or ceramic or silicon or gallium arsenide.

Figure 7:
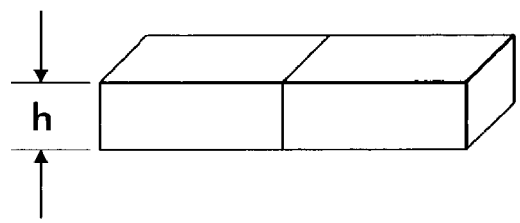
FIG. 7 shows a metal strip with no stress gradient.

As shown in FIG. 7, a strip of metal having no stress gradient inherent in the metal will lie flat. However, as shown in FIG. 8, when a uniform stress gradient is introduced into the strip of metal, the strip bends into an arc.

Figure 8:
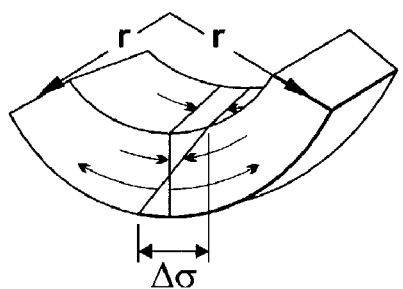
FIG. 8 shows a model for determining the curvature of a spring contact due to the stress gradient.

Each spring contact 15 is formed such that the stress gradient shown in FIG. 8 is introduced into the spring contact 15. When the spring contact 15 is formed, the metal layer comprising the spring contact 15 is deposited such that compressive stress is present in lower portions of the metal layer and tensile stress is present in upper portions of the metal layer. FIG. 8 shows the stress difference Δσ (i.e., the difference in stress from the top to the bottom) present in the spring contact 15. Compressive stress in lower portions of the metal layer is depicted by arrows directed to the left. Tensile stress is depicted in upper portions of the metal layer by arrows directed to the right. The stress gradient (stress difference divided by thickness) causes the spring contact 15 to bend into the shape of an arc having a radius r. Equation 1 gives the radius of curvature r of the spring contact 15:

$$r = \left(\frac{y}{1-v}\right)\frac{h}{\Delta\sigma} \qquad (1)$$

where y is the Young's modulus of the metal, h is the thickness of the metal layer forming the spring contact 15, Δσ is the stress difference, and v is the shear modulus of the metal.

Referring again to FIG. 6, r is the radius of curvature of the free portion 11 of the spring contact 15 as predicted in Equation 1, and θ is the angle separating the radius line directed toward the junction of the free portion 11 with the anchor portion 12 and the radius line directed toward the tip 30 of the free portion 11. Equation 2 gives the approximate height b of the spring contact tip 30 from the substrate 14 for angles θ<50°:

$$b \approx \frac{L^2}{2r} \qquad (2)$$

where L is the length of the free portion 11 and r is the radius of curvature of the free portion 11.

Since each spring contact 15 is preferably made of a highly elastic material, each spring contact 15 can be pushed down at the tip 30 and deformed as shown in FIG. 6, but will not plastically deform. Typically, a contact pad 3 of a device 101 exerts the downward force placed on the tip 30 and electrically contacts the tip 30. The spring contact 15 resists the downward force placed on the tip 30 and maintains electrical contact with the contact pad 3.

When the force on the tip 30 is released, the spring contact will return to its undeformed state. Thus, the elasticity of the spring contacts 15 allows the spring contacts 15 to make numerous electrical connections with different contact pads 3 while maintaining the integrity of the electrical connection between the spring contact tip 30 and the contact pads 3.

Additionally, the spring contact 15 is preferably made of a creep resistant material. Therefore, when the spring contact 15 is elastically deformed over an extended period by a contact pad 3 pressing down on the spring contact tip 30, the spring contact 15 resists the downward force and pushes the spring contact tip 30 against the contact pad 3, maintaining the electrical connection.

Figure 9:
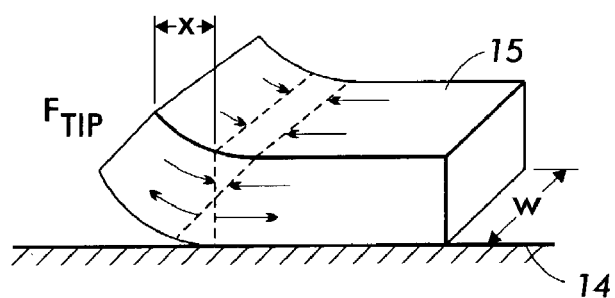
FIG. 9 shows a model for determining the amount of reaction force exerted at the tip of the spring contact.

FIG. 9 shows a model for determining the amount of force $F_{tip}$ applied by the spring contact tip 30 to a contact pad 3 in reaction to the force of the contact pad 3 pressing down on the spring contact tip 30. Equation 3 gives the reaction force $F_{tip}$ of the spring contact tip 30:

$$F_{tip} = \frac{wh^2 \Delta\sigma}{12x} \quad (3)$$

where w is the width of the spring contact 15, h is the thickness of the spring contact 15, $\Delta\sigma$ is the stress gradient and x is the horizontal distance from the spring contact tip 30 to the point where the spring contact 15 first touches the substrate 14.

For a given width w, thickness h and stress gradient $\Delta\sigma$, the reaction force $F_{tip}$ of the tip 30 varies inversely with the distance x. Therefore, the reaction force $F_{tip}$ increases as the spring contact tip 30 gets closer to the substrate 14, since the distance x decreases as the spring contact 15 collapses and presses against the substrate 14 as shown in FIG. 6. The increase in the reaction force $F_{tip}$ as the contact pad 3 presses the spring contact tip 30 closer to the substrate 14 generally improves the electrical connection between the spring contact tip 30 and the contact pad 3. The increasing reaction force $F_{tip}$ causes the spring contact tip 30 to deform locally at the contact pad 3, increasing the area of contact between the contact pad 3 and the spring contact tip 30.

FIGS. 10–13 show the basic steps in one method for forming a spring contact 15. In FIG. 10, a contact pad 3 is formed on or over a substrate 14. Additionally, an release layer 13 is formed on or over the substrate 14. However, as mentioned above, the release layer 13 is not required and can be eliminated.

In FIG. 11, a layer of metal 16 is deposited on or over the substrate 14. In the preferred embodiment of the invention, the metal is the nickel-zirconium alloy described above. Part of the metal layer 16 is electrically connected to or directly contacts the contact pad 3 and another portion of the metal layer 16 is deposited on or over the release layer 13. There are many methods available for depositing a metal layer 16 on or over the substrate 14, including electron-beam deposition, molecular beam epitaxy, chemical vapor deposition and sputter deposition. Preferably, the metal layer 16 is sputter deposited.

When sputter depositing a metal, the metal to be deposited is placed on a target and set to a high negative voltage. A stream of plasma gas, typically argon, is directed towards the target. The high voltage potential between the plasma gas and the target metal produces ions which are accelerated toward and bombard the metal target. This bombardment knocks small particles of the metal target free and the freed particles are guided to the surface where the particles are deposited.

The metal layer 16 is deposited in several sub-layers 16-1 to 16-n to a final thickness h of approximately 1 $\mu$m. The stress difference $\Delta\sigma$ is introduced into the metal layer 16 by altering the stress inherent in each of the sub-layers 16-1 to 16-n of the metal layer 16, as shown in FIG. 11, each sub-layer 16-x having a different level of inherent stress.

Different stress levels can be introduced into each sub-layer 16-x of the deposited metal layer 16 during sputter deposition in a variety of ways, including adding a reactive gas to the plasma, depositing the metal at an angle, or varying the deposition angle, and changing the pressure of the plasma gas. Preferably, the different levels of stress are introduced into the metal layer 16 by varying the pressure of the plasma gas, which is preferably argon.

Figure 14:
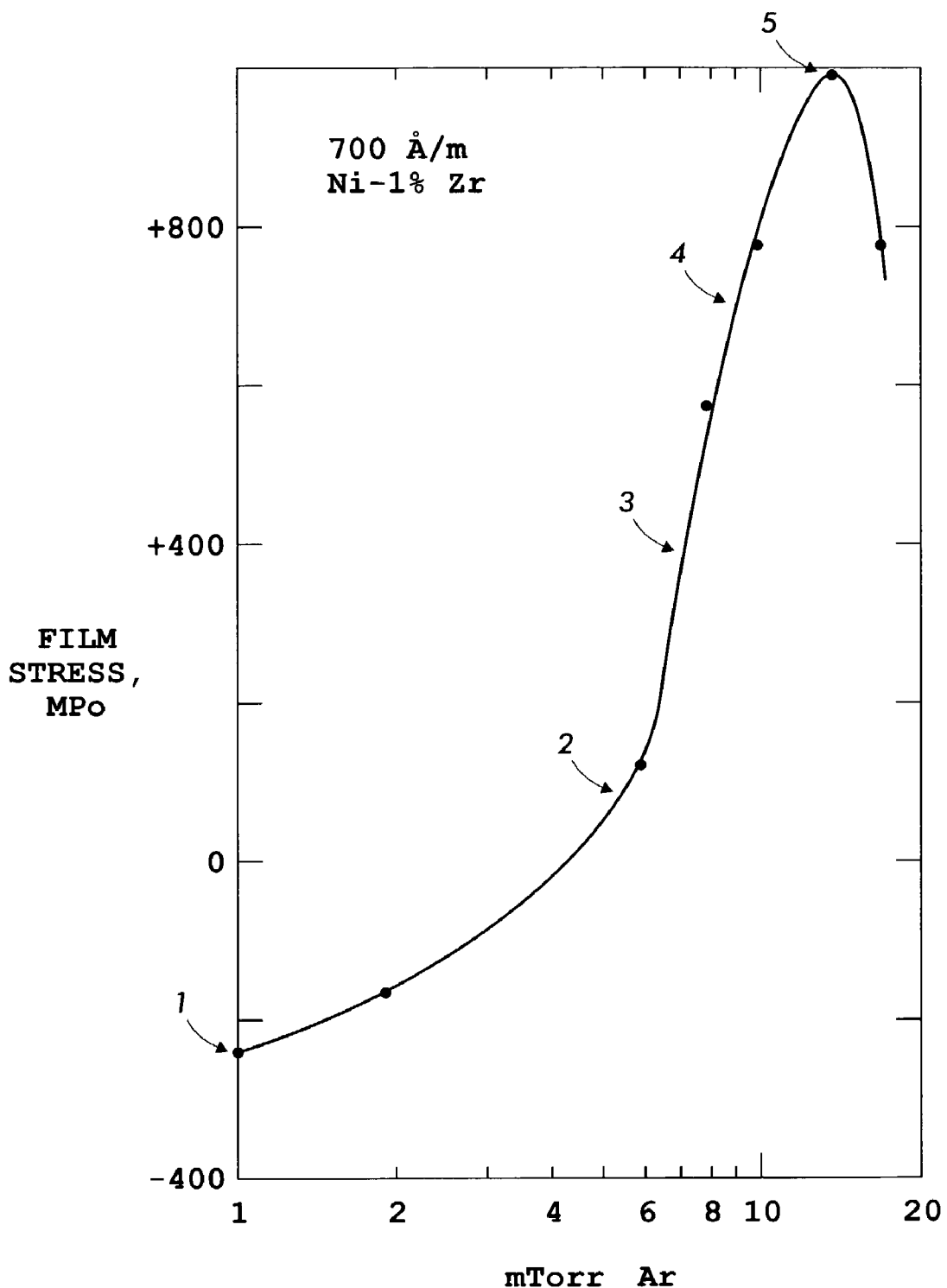
FIG. 14 is a graphic representation of the film stress in a sputter deposited nickel-zirconium alloy as a function of plasma gas pressure.

FIG. 14 is a graph showing the relationship of the film stress in the sputter deposited nickel-zirconium alloy and the pressure of the plasma gas used in the deposition. For low pressures of the plasma gas, approximately 1 mTorr, the film stress in the deposited metal is compressive. As the pressure of the plasma gas increases, the film stress in the deposited sub-layer changes to a tensile stress and increases with increasing plasma gas pressure.

Preferably, the metal layer 16 is deposited in five sub-layers 16-1 to 16-5. The first sub-layer 16-1 is deposited at a plasma gas pressure of 1 mTorr, as indicated by numeral 1 in FIG. 14. The first sub-layer 16-1 is the bottom-most layer in the metal layer 16 and has an inherent compressive stress. The second sub-layer 16-2 is deposited on top of the first sub-layer 16-1 at a plasma gas pressure of approximately 6 mTorr. The second sub-layer 16-2 has a slight inherent tensile stress, as indicated by numeral 2 in FIG. 14. Sub-layers 16-3, 16-4 and 16-5 are then deposited one on top of the other at the plasma gas pressures indicated by numerals 3, 4 and 5 in FIG. 14.

The process of depositing the metal layer 16 in five separate sub-layers 16-1 to 16-5 results in the metal layer 16 having a stress difference $\Delta\sigma$ which is compressive in the lower portion of the metal layer 16 and becomes increasingly tensile toward the top of the metal layer 16. Although the stress gradient urges the metal layer 16 to bend into an arc, the metal layer 16 adheres to the release layer 13, the substrate 14 and the contact pad 3 and thus lies flat.

After the metal layer 16 is deposited, the metal layer 16 is photolithographically patterned into the spring contacts 15. Photolithographic patterning is a well-known technique and is routinely used in the semiconductor chip industry. Photolithographically patterning the metal layer 16 is completed generally as shown in FIGS. 11–13. A photosensitive material 17 is evenly deposited on the top surface of the metal layer 16. The photosensitive layer 17 is then soft-baked at a temperature of approximately 120° F. The photosensitive layer 17 is then exposed to light, typically in the ultra-violet spectrum, using an appropriate mask. The mask ensures that areas of the photosensitive material 17 are appropriately exposed to the light which describes a two-dimensional view of the spring contacts 15.

Once the photosensitive material 17 is exposed to the appropriate pattern of light, the photosensitive material 17 is developed and hard-baked at a temperature of approximately 200° F. The elastic material 16 is then etched to form the spring contacts 15. Different methods for etching can be used, including ion milling, reactive ion etching, plasma etching and wet chemical etching. Preferably, wet chemical etching is used.

Figure 15:
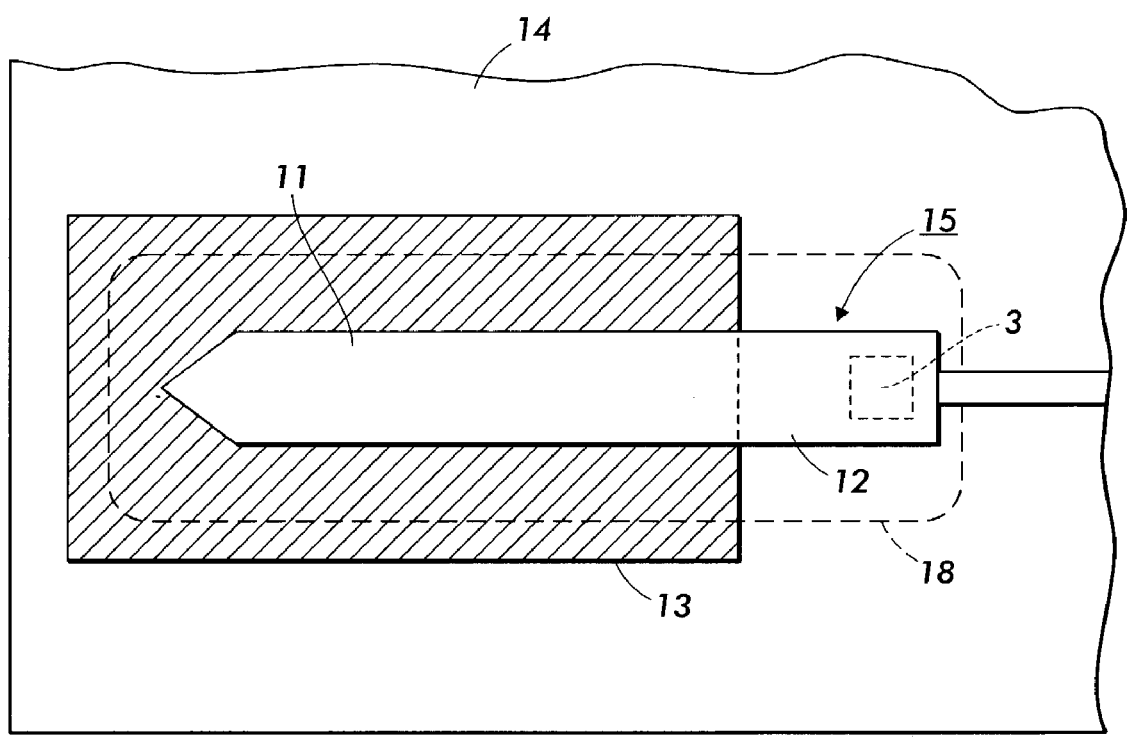
FIG. 15 is a top view of a spring contact.

The wet chemical etchant, for example, a nitric acid solution, is applied to the elastic material 16. The etchant removes appropriate areas of the photosensitive material 17, determined by which areas of the photosensitive material 17 were exposed or not exposed to the light and the type of photosensitive material 17 used. When the appropriate areas of photosensitive material 17 are removed, the etchant removes the areas of the metal layer 16 lying under the removed areas of photosensitive material 17. The remaining areas of the metal layer 16 form the spring contacts 15. A top-view of one spring contact 15 is shown in FIG. 15. The area of the metal layer 16 removed by the etchant is described by the dashed line 18.

Next, as shown in FIG. 12, the free portion 11 of the spring contact 15 is released from the release layer 13 by a process of under-cut etching. Until the free portion 11 is released from the release layer 13, the free portion 11 adheres to the release layer 13 and the spring contact 15 lies flat on the substrate 14. A second layer of the photosensitive material 17 is deposited on top of the spring contacts 15 and on the area surrounding the spring contacts 15. The second layer of the photosensitive material 17 is then exposed to light using the appropriate mask, developed and hard-baked. A selective etchant is then applied to the photosensitive material 17 and removes areas of the photosensitive material 17 around the spring contacts 15. The etchant is called a selective etchant because after the areas of photosensitive material 17 around the spring contacts 15 are removed, the etchant proceeds to etch the release layer 13 underneath the spring contacts 15. The photosensitive material 17 on top of the spring contacts 15 resists the selective etchant and protects the spring contacts 15. The selective etchant etches the release layer 13 faster than the selective etchant removes metal from the spring contacts 15. This means that the spring contacts 15 are released from the release layer 13 and are allowed to bend up and away from the release layer 13 due to the stress gradient in the spring contacts 15.

Only those areas of the release layer 13 under the free portion 11 of the spring contact 15 are under-cut etched. The area of release layer 13 under-cut etched for each spring contact 15 is described by the shaded portion in FIG. 17. This means that the anchor portion 12 of the spring contact 15 remains fixed to the release layer 13 and does not pull away from the release layer 13. It should be appreciated that the method for patterning the metal layer 16 onto the spring contacts 15 should not result in any annealing of the metal layer 16.

Once the free portion 11 is freed from the release layer 13, the stress gradient causes the free portion 11 to bend up and away from the substrate 14. The stress gradient is still inherent in the anchor portion 12 and urges the anchor portion 12 to pull away from the substrate 14.

To decrease the chance of the anchor portion 12 pulling away from the substrate 14, the spring contact 15 can be annealed to relieve the stress in the anchor portion 12. This annealing process does not affect the free portion 11 because, once the free portion 11 is released and allowed to bend up, no stress remains on the free portion 11 to be relieved by annealing. Thus, the stress gradient remains in the free portion 11, and the free portion 11 remains curved up and away from the substrate 14 after annealing.

Finally, FIG. 13 shows a layer of gold 19 plated over the outer surface of each spring contact 15. The layer of gold 19 is preferably used to reduce the resistance in the spring contacts 15, but can be replaced with any other conductive material. Preferably, the gold layer 19 is plated on the spring contacts 15 using a plating process.

Additional steps can be added to the under-cut etching process to improve the process if necessary. For example, etchant vias, or small windows, can be etched into the free portions 11 of the spring contacts 15. The etchant vias operate to provide the selective etchant faster access to the release layer 13, thereby speeding the process of releasing the free portions 11 from the release layer 13. Also, a hard mask can be applied to the top surface of the spring contacts 15 to ensure that the selective etchant does not remove material from the top surface of the spring contacts 15 in case the photosensitive material 17 protecting the top of the spring contacts 15 fails.

Since the process for forming the spring contacts 15 is limited only by the design rules of photolithographic patterning, many hundreds or thousands of spring contacts 15 can be formed closely together in a relatively small area on the substrate 14. The typical width w of the spring contact 15 is 40–60 μm. Therefore, the spring contacts 15 can be formed close together, at a spacing of approximately 10–20 μm. This makes the center-to-center distance between adjacent spring contacts 15 approximately 50–80 μm, which is well within the typical center-to-center distance between adjacent contact pads 3 on a standard semiconductor chip 2.

To test the effectiveness of the spring contacts 15 in applications similar to those found in solder-bump flip-chip bonding, a test array of the spring contacts 15 at a center-to-center spacing of 80 mm was developed as shown in FIG. 16. Four sets of arrays 20 of the spring contacts 15 were formed on a bottom substrate 21. Four corresponding arrays of linked contact pads 22 were formed on an upper substrate 23. The upper substrate 23 and the lower substrate 21 were brought together such that the spring contacts 15 contacted a corresponding contact pad 3. The resistance R was then measured across pairs of the spring contact 15 leads.

Figure 17:
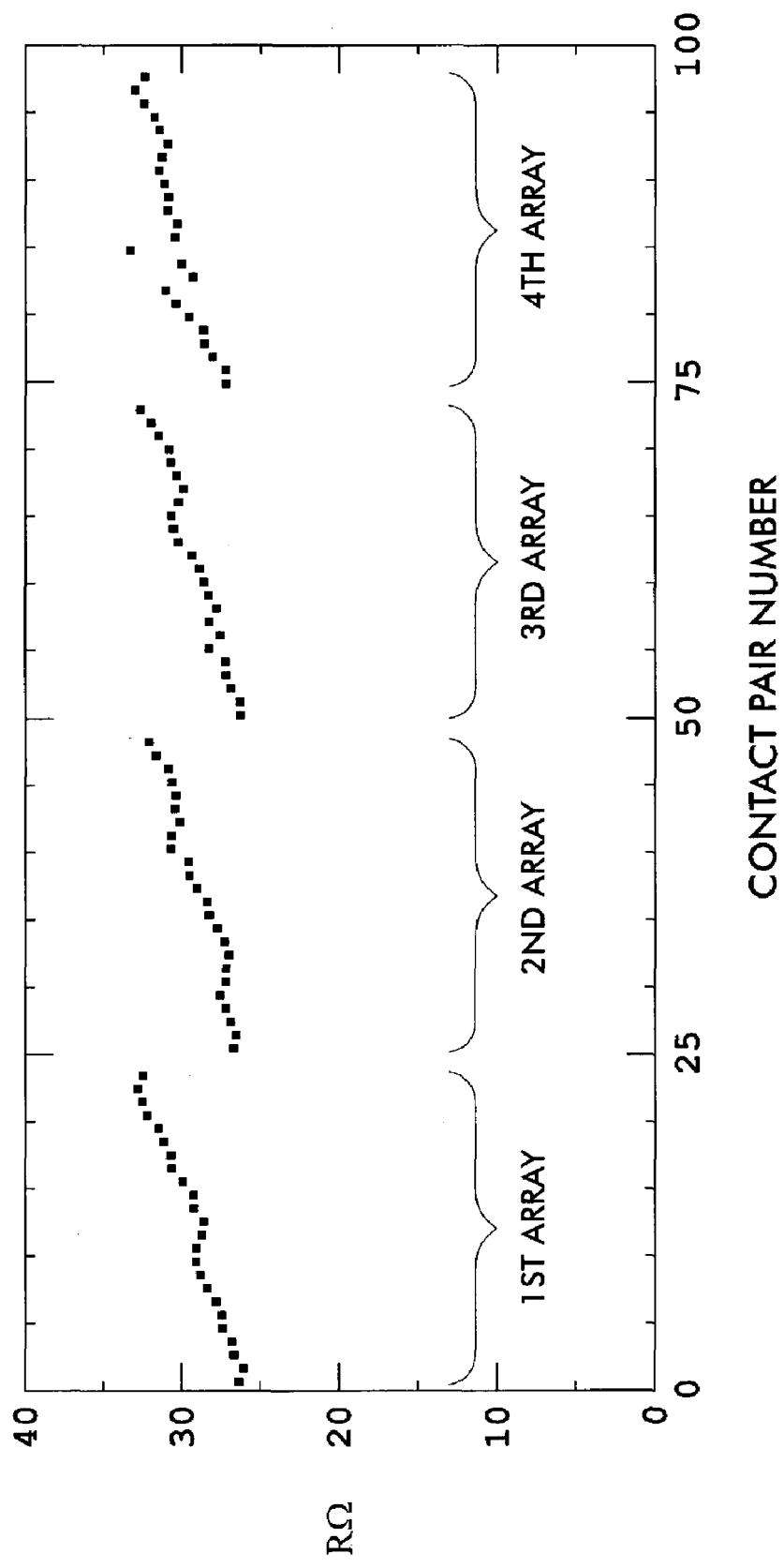
FIG. 17 is a graphical representation of the detected resistance of a plurality of spring contact pairs.

FIG. 17 graphically depicts the measured resistance R for each spring contact pair in the test apparatus. The measured resistance R within each array generally trends upward from left to right because of the increased conductor length of the spring contacts 15 positioned to the right compared to the spring contacts 15 positioned to the left in each array. Most of the approximately 25–30 ohms of resistance measured for each spring contact 15 pair is due to the length and geometry of the conductors extending between the spring contacts 15 and the contact pads 3.

Figure 18:
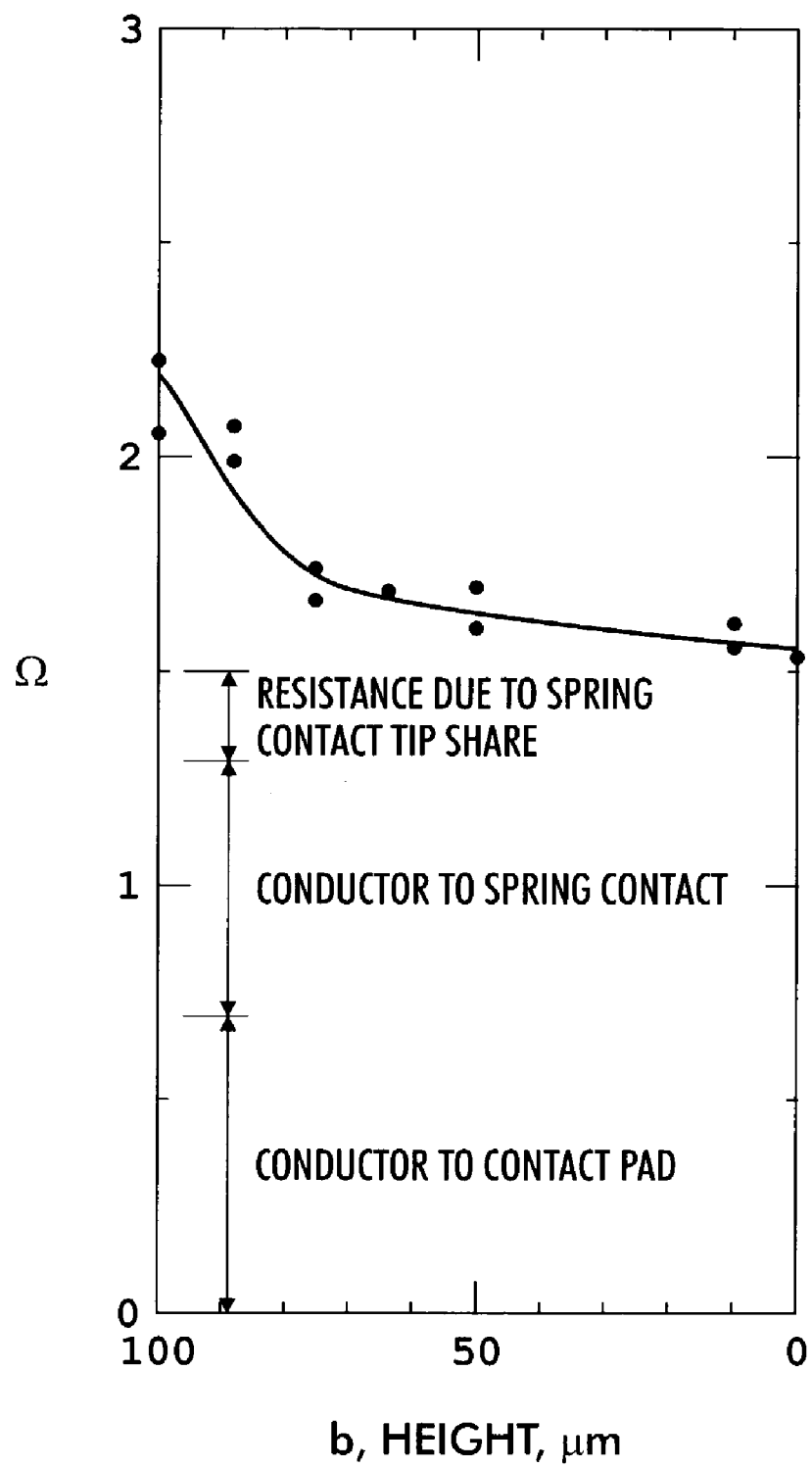
FIG. 18 is a graphic representation of the contact resistance of a spring contact as a function of the distance between the contact pad and the substrate.
Figure 21:
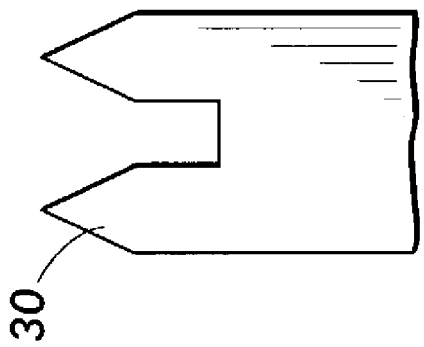
FIG. 21 is a spring contact having two points t the tip end.
Figure 20:
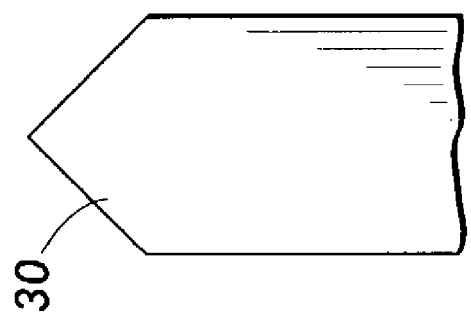
FIG. 20 is a spring contact having a pointed end.
Figure 19:
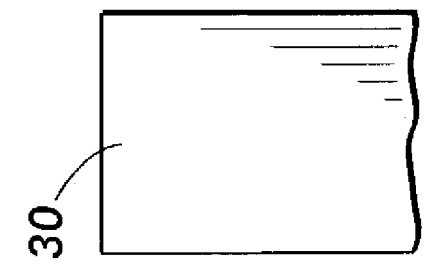
FIG. 19 is a spring contact having a flat end.
Figure 22:
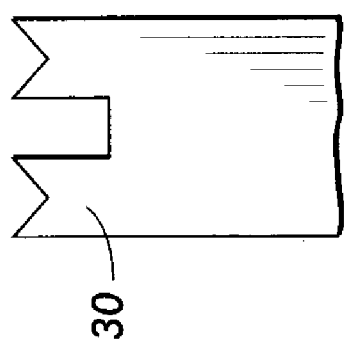
FIG. 22 is spring contact having multiple points at the tip end.
Figure 23:
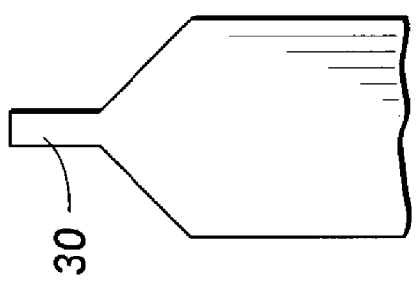
FIG. 23 is a spring contact having a deformable tab at the tip end.
Figure 24:
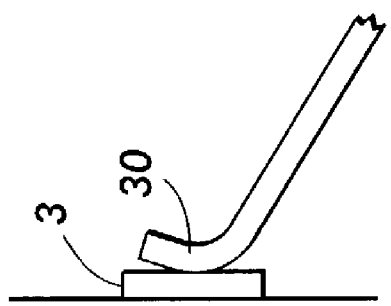
FIG. 24 shows a spring contact having a deformed tab end when forced against a contact pad.

FIG. 18 shows the total resistance of the connection between a spring contact 15 and corresponding contact pad 3. As shown in FIG. 18, approximately 1.5 ohms of resistance is due to the conductors leading to the contact pad 3 and the spring contact 15. Approximately 0.2 ohms of resistance is due to the shape of the spring contact tip 30. The remaining resistance, approximately 0.5–0.8 ohms, is the resistance at the interface between the contact pad 3 and the spring contact tip 30.

In general, the resistance at the interface between the contact pad 3 and the spring contact tip 30 decreases as the height b decreases. As mentioned above, the reaction force $F_{tip}$ that the spring contact tip 30 exerts against the contact pad 3 increases as the contact pad 3 pushes the spring contact tip 30 closer to the substrate 14. The increased reaction force $F_{tip}$ causes the spring contact tip 30 to locally deform at the contact pad 3, thereby increasing the contact area and decreasing the resistance at the interface.

The shape of the spring contact tip 30 takes different forms depending on the application. FIGS. 19–24 show a series of six different tip 30 shapes tested. Although only four of each type of spring contact tip 30 were tested, none of the spring contact tip 30 shapes showed a significant superiority over any other type of spring contact tip 30.

Figure 25:
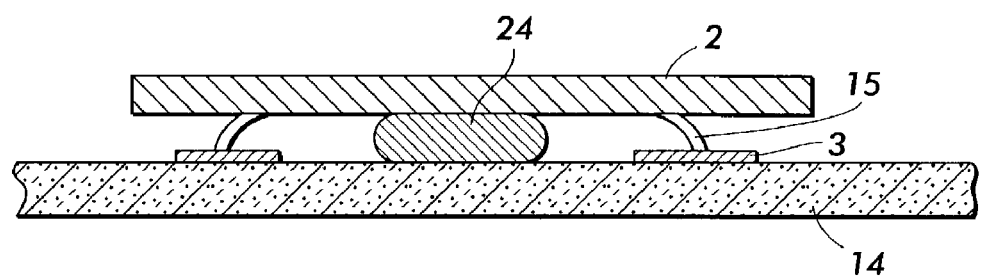
FIG. 25 is a chip having a plurality of spring contacts electrically bonded to a substrate.
Figure 26:
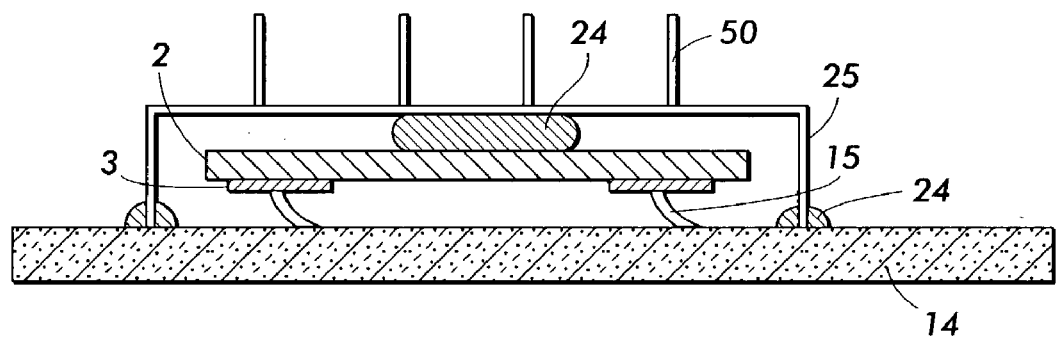
FIG. 26 is a chip bonded to a dust cover and having a plurality of spring contacts electrically contacted to a substrate.

As mentioned above, since the production of the spring contacts 15 is limited only by the design rules of photolithographic patterning, the spring contacts 15 can be used to interconnect numerous different types of devices. For example, FIGS. 25–26 show the substrate 14 having a plurality of spring contacts 15 formed on the top surface of the substrate 14. The contact pads 3 formed on the lower surface of the chip 2 are electrically connected to corresponding spring contacts 15 on the substrate 14. An adhesive 24 holds the chip 2 stationary relative to the substrate 14. A dust cover, or can, 25 covers the chip 2 and is hermetically sealed to the substrate 14. The dust cover 25 assures that moisture and other foreign substances do not corrode the spring contacts 15 or the contact pads 3, or otherwise interfere with the electrical connections between the individual spring contacts 15 and the corresponding contact pads 3.

FIG. 28 shows an alternate embodiment of a connecting device for electrically connecting two devices. A wafer 26 is shown having a plurality of spring contacts 15 formed on opposite sides of the wafer. Pairs of the spring contacts 15 on opposite sides of the wafer 26 communicate with each other and electrically connect the contact pads 3 on both the chip 2 and the substrate 14. This embodiment of the invention allows processing of the chip 2 and the substrate 14 without risking damage to the spring contacts 15. The wafer 26 is used to interconnect the chip 2 and the substrate 14 only after all processing is completed on the chip 2 and the substrate 14.

Figure 27:
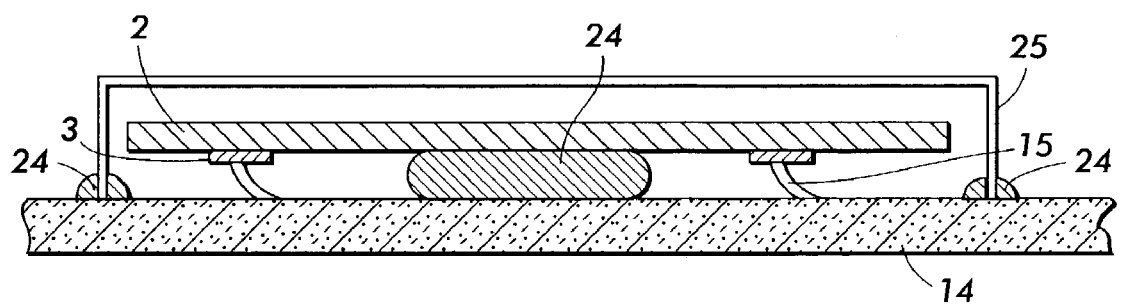
FIG. 27 is a chip bonded to a substrate and electrically contacted to a substrate by a plurality of spring contacts on the chip having a dust cover.

FIG. 27 shows another embodiment of the invention. The spring contacts 15 are formed on the lower surface of the chip 2. The spring contacts 15 contact corresponding contact pads 3 on the substrate 14. The adhesive 24 holds the chip 2 stationary with respect to substrate 14.

The spring contacts 15 are not limited to interconnecting a chip 2 to a substrate 14 or circuit board. The spring contacts 15 are used equally well to interconnect two chips 2, two circuit boards, or other electronic devices to each other. One such alternative use for the spring contacts 15 is in probe cards. As discussed above, probe cards 7 are used to temporarily connect two devices, typically when one of the devices is tested. Such testing is common in the semiconductor industry, where the probe cards 7 are used to test semiconductor chips while the chips are still part of a single-crystal silicon wafer.

FIG. 29 shows an embodiment of the invention where the probe card 27 has an array of spring contacts 15 used in place of the standard probe needles 8. The probe card 27 operates identically to the standard probe card 7 except for having spring contacts 15. The probe card 27 is aligned with the device 10 such that the spring contacts 15 compliantly contact the corresponding contact pads 3 on the device 10. The device 10 is then tested or communicated with by a testing device electrically connected to the probe card 27.

Figure 30:
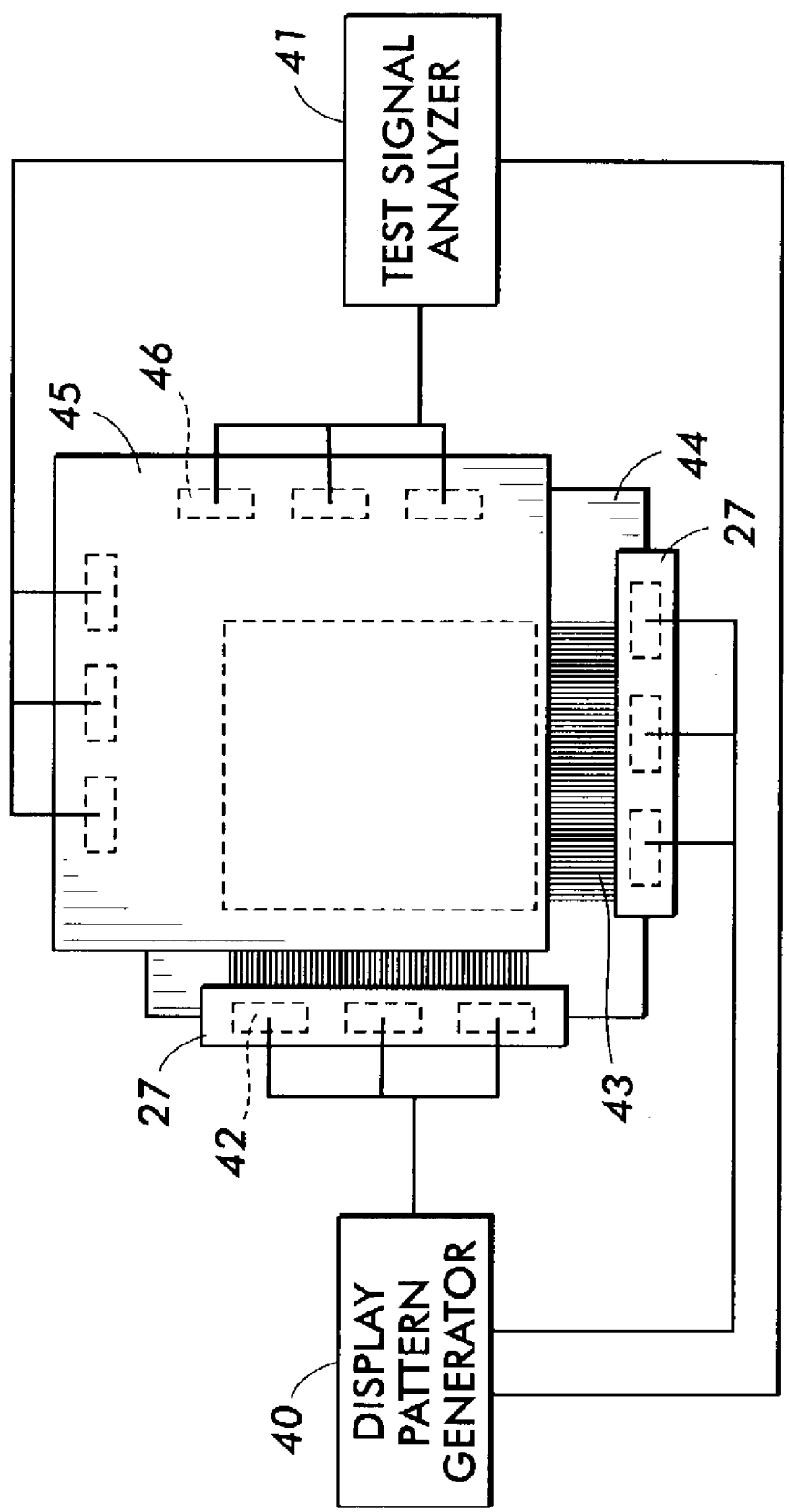
FIG. 30 is a liquid crystal display and a device for testing the operation of the display.
Figure 35A:
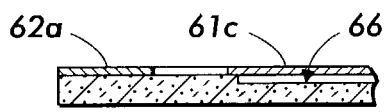
FIG. 35 illustrates a multi-turn coil formed from a series of connected loops.
Figure 35B:
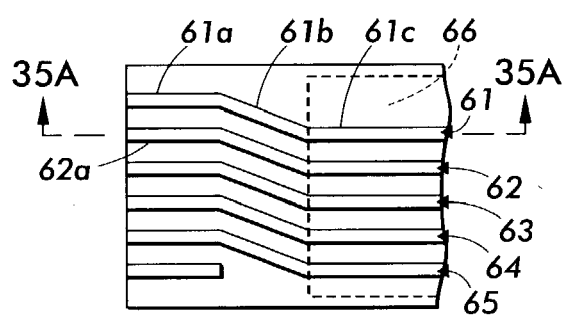
Figure 35C:
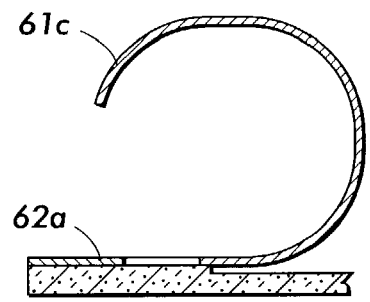
Figure 35D:
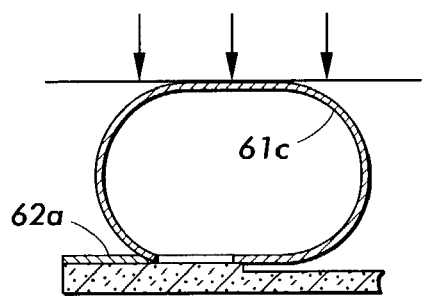
Figure 35E:
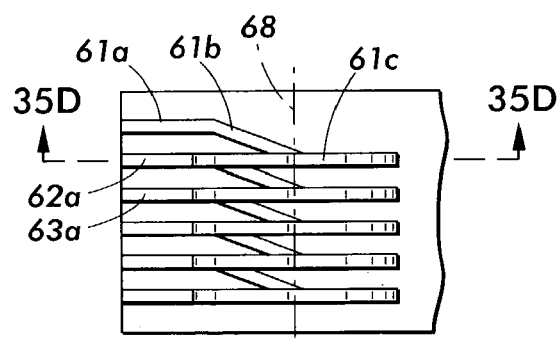

An example testing device is shown in FIG. 30. A display pattern generator 40 communicates with driver chips 42 mounted on the two full-width probe cards 27. The probe cards 27 have the spring contacts 15 which contact associated addressing lines 43 formed on the display plate 44. The addressing lines 43 communicate with display electrodes (not shown). Therefore, the display pattern generator 40 can drive the display electrodes to produce a matrix of electric potentials corresponding to a test image. Sensors (not shown) on the sensor plate 45 detect the matrix of electric potentials on the display electrodes and generate signals each corresponding to the electric potential. The signals are read out by scanner chips 46 mounted on the sensor plate 45. The test signal analyzer 41 receives the signals from the scanner chips 46 and forms a sensed image corresponding to the signals. The test signal analyzer 41 then compares the sensed image with the test image output by the display pattern generator 40 to determine if the display plate 44 and display electrodes are working properly.

Since producing a standard probe card 7 having probe needles 8 is labor intensive and time-consuming, standard probe cards 7 are not generally made to contact all of the addressing lines 43 on the display plate 44. Therefore, testing of the display plate 44 must be done in sections since the probe cards 7 cannot accommodate the full width of the addressing lines 43. In contrast, the probe card 27 made with spring contacts 15 can be made easily and inexpensively. Also, the probe cards 27 having the spring contacts 15 can be made to any width and therefore can test all of the data or address lines of an apparatus, such as the display shown in FIG. 26, at one time.

The foregoing techniques for the manufacture of springs for probe cards and other applications can be extended to the manufacture of coil structures. Springs are made by introducing an intrinsic stress profile of a certain amount designed to produce the desired spring height and curvature. Similarly, a reproducible built-in stress gradient or intrinsic stress profile can be designed into a thin film by varying the growth conditions appropriately during deposition to produce coil structures, i.e. a spring which bends back on itself producing a loop winding and contacting the substrate. By adding one or more conductive layers, a coil structure suitable for use as an inductor may be manufactured.

The intrinsic stress of many sputtered thin films depends on the ambient pressure at which the material is deposited. By varying the pressure during sputtering, films can be obtained that are compressively stressed near the substrate-film interface and tensile stressed at the film surface. FIG. 32 shows such a stress-graded film 104 sandwiched between two gold layers 102, 106. The stress graded film can be NiZr, Mo/Cr, solder-wettable Ni, or other suitable material. The bottom gold layer 106 forms the outer skin of the coil when released and provides a high conductivity path for electrons at high frequencies. The top gold layer passivates the surface. The metal stack is deposited above a suitable release layer 108 such as Ti, Si, or SiN. The release layer should be a material that can be quickly removed by selective dry or wet undercut etching. Possible etchants for a Si release layer include KOH (wet processing) and $XeF_2$ (dry processing).

In FIG. 33, a released structure with continuous layers 106 and 104 is shown. The challenge of connecting the free end of the loop to a contact pad on the same substrate is made difficult by the fact that the loop typically has a constant radius of curvature, and therefore the free end will naturally return to the take-off point. Several techniques can be used to resolve this problem as described below.

The scanning electron micrograph in FIG. 34 shows a series of out-of-plane micro-inductor windings produced according to the invention. The coil windings were made using stress engineered thin films that are deposited by sputtering. The film is photolithographically patterned into strips of micro-springs or elastic members that are subsequently released from their underlying substrate. Upon release, the built-in stress gradient causes the elastic members to curl and form three-dimensional out-of-plane loops that make up the inductor coil. In the coil shown in FIG. 34, each loop has just enough helical pitch for each free end to contact the adjacent pad of the array. The helical twisting provides the useful feature that the free end of the elastic member is shifted longitudinally (or axially) from the take-off point. This allows for the formation of a continuous inductor consisting of multiple turns without interruption of the spring metal. To protect the inductor in actual use on a chip or circuit board, the loops can be enclosed in a molding compound.

In the specific example of FIG. 34, the stress graded metal is a 0.3 μm-thick 85 Mo/15 Cr alloy deposited at five progressively increasing pressures. The film was patterned into 4 μm wide elastic members that were then released by removing an underlying PECVD SiN layer using 10:1 buffered HF. The released elastic members formed 70 μm diameter circular loops. After rinsing in D.I. water, the released elastic members were pressed against a flat surface and the substrate was heated to 85° C. The compression holds the springs tightly while water is slowly evaporated. This technique prevents liquid surface tension from pulling adjacent elastic members into a tangled mess as water evaporates. For many applications, wider and thicker elastic members forming bigger loops are desired. These larger coils are easier to make than those in FIG. 34 because less stress gradient is required. Furthermore, wider springs are stiffer and generally less susceptible to getting entangled with adjacent members during spring release.

FIG. 35 shows some of the process steps for forming a multi-turn coil structure from a series of individual circular coil structures. Initially, a plurality of elastic members 61a–65a are patterned over a release window. Each elastic member 61a–65a is part of a larger patterned structure 61–65. For example, structure 61 includes elastic member 61a, connecting pad 61b and contact pad 61c. To form a continuous structure, each loop must be electrically connected to the next adjacent loop. After remove of release window 66, each elastic member 61a–65a coils back on itself. When released, the elastic members 61a–65a will form circular loops with radiuses given by equation (1) above. The length of each of 61a–65a is designed so that the elastic members do not span complete loops when released. The tips (free ends) are left hanging just shy of an opposite contact, which is the contact pad 62c–65c of the adjacent loop. The loops are then pressed down on the contact and soldered or plated together. The resultant multi-turn coil structure, with coil axis 68 begins at 61a–61b, then the first loop winding 61c, which is connected to contact pad 62a, and so on.

Figure 36A:
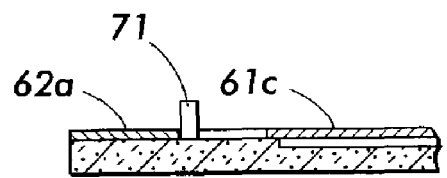
FIG. 36 illustrates positioning the second anchor portion with a mechanical stop.
Figure 36B:
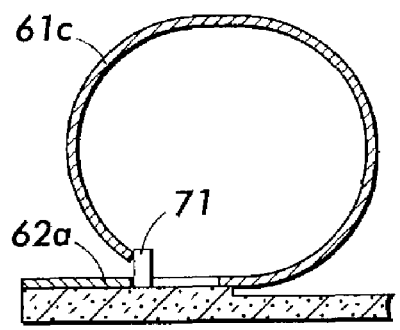
Figure 36C:
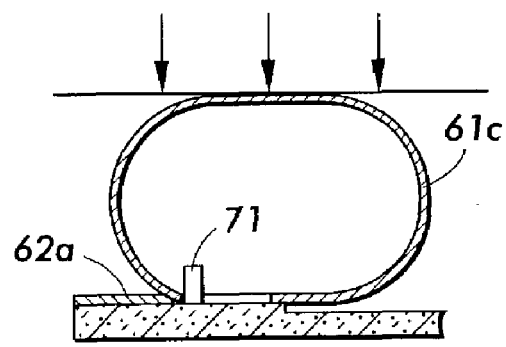
Figure 37:
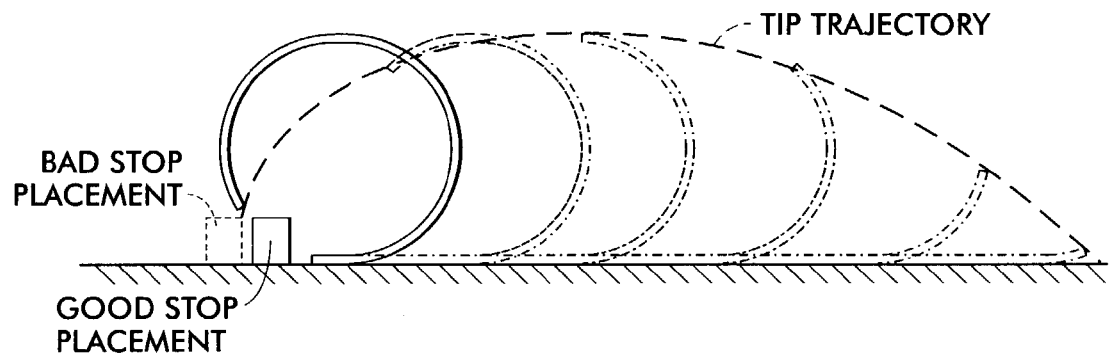
FIG. 37 illustrates positioning of the mechanical stop of FIG. 36.

FIGS. 36 and 37 show an alternative approach for forming the coil connections. In this approach, a mechanical barrier or stop 71 is fixed to the substrate at the end of contact pad 62c, in order to receive the tip of elastic member 61c. This approach uses almost full-length elastic members aided by a mechanical barrier 71. It is important to design the dimensions of the mechanical stop properly and to position the stop correctly so that the structure lies entirely within the trajectory of the tip as illustrated in FIG. 37. Otherwise, the elastic members may be caught on the near edge of the stop during release. In FIG. 37, the dashed line shows the tip trajectory.

Figure 38:
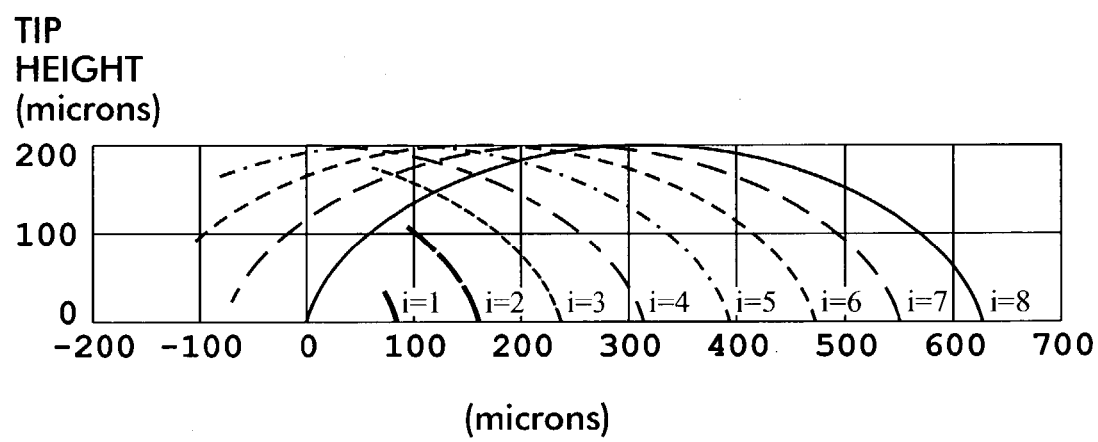
FIG. 38 is a graph of tip trajectories for different elastic member lengths for a coil radius of 100 µm.
Figure 39A:
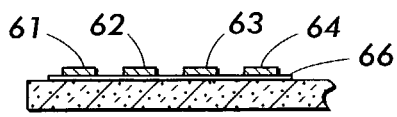
FIG. 39 illustrates forming a multi-turn coil from individual tilted coils.
Figure 39B:
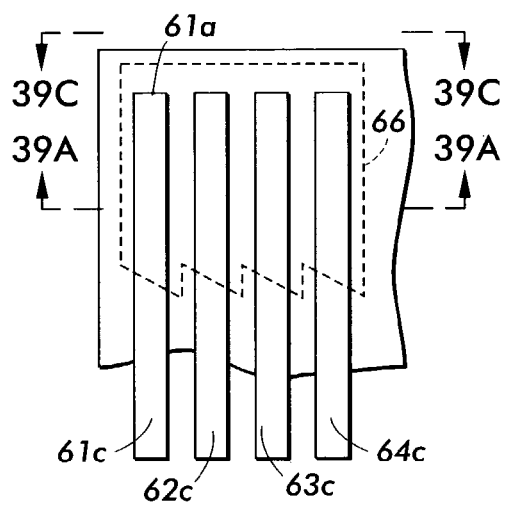
Figure 39C:
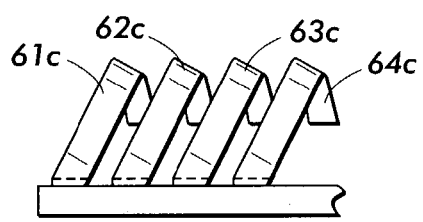
Figure 39D:
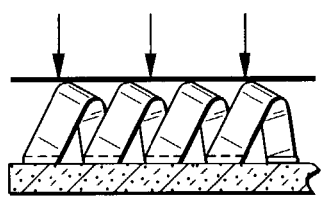
Figure 39E:
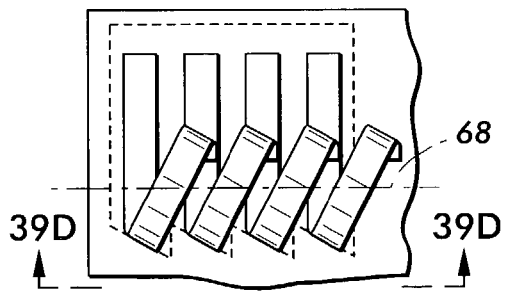

FIG. 38 shows a graph of tip trajectories for 200 μm diameter coils having different elastic member lengths. The parameter in the figure, i, corresponds to length of the elastic member in multiples of πr/4, where r is the coil radius. The x=0 point in the figure is the edge of the release window. It is interesting to note that the tip of the full length spring, i=8, stays on the right of the release edge throughout its entire trajectory. Since the mechanical block has to be placed at x<0, the length of the elastic member needs to be made less than a full circumference. The range of possible trajectories also place constraints on the dimensions of the mechanical block.

In addition to the mechanical stop, another method for positioning the free tip tangentially, away from the takeoff point includes varying the radius of curvature of the elastic member. If the radius of curvature if varied along the length of the elastic member, a generally circular coil will be formed. An unequal radius of curvature will cause the free tip to stop at some point away from the takeoff point. If the radius of curvature varies as a function of length and width of the elastic member, a helical coil will be formed. The radius of curvature of the elastic member may be varied, for example, by adding a load layer uniformly across the width of one or more portions of the elastic member. The radius of curvature may also be varied by patterning one or more openings or perforations uniformly across the width of a portion of the elastic member. Some combination of load layer and perforations (or openings) may also be used. Perforations and load layers may also be used to create helical windings as described below.

FIG. 39 shows another approach for forming a multi-turn coil with individual loop windings. In this embodiment, release window 66 is defined to have a skewed angle relative to the run length of each elastic member 61c–64c. When the elastic member is released, the coil loops lean sideways contacting the adjacent contact pad. Thus loop winding 61c contacts pad 62a. This lateral bending can also be induced by designing a built-in stress anisotropy in the springs (described below). When the springs are pressed down, their tips slide over to neighboring contact pads and a continuous coil is formed.

To take full advantage of the available conducting path, the coil thickness, h, should be made at least as thick as the skin depth δ:

$$h \geq \delta = \sqrt{\frac{\rho}{\pi \mu f}} \quad (4)$$

where ρ is the resistivity of the coil conductor, μ is its magnetic permeability, and f is the operating frequency. Making the film thicker than the skin depth does not improve film conductance because most of the current is confined to within the skin depth of the conductor surface. For frequencies of interest (around 1 GHz), the ideal film thickness is between 1 μm to 3 μm, a thickness range that is compatible with current deposition and patterning processes.

If the coil material is composed of one elastic material with a stress gradient, with the film thickness determined, the coil loop radius can be calculated using equation 1. If there are additional layers, the stress profile is not a linear gradient and equation 1 needs to be modified. The spring length, l, should then be designed to about $$l = 2\pi r \quad (5)$$

for the elastic members to form complete circular loops when released. The number of coil turns, N, is next determined based on a desired inductance which approximately equals:

$$L = \mu_0 \frac{N \pi r^3}{x} \quad (6)$$

where x is the pitch between coil windings and $\mu_0$ is the permeability of air (for air-cored coils). While equation 6 is good for toroids and long solenoid (N*x>>r), more complicated expressions for short solenoids are available from textbooks. The spring width, w, can be made as wide as necessary to accommodate an acceptable electrical resistance, R, through the following approximation:

$$w = \frac{2\pi r \rho N}{\delta R} \quad (7)$$

Equations 6 and 7 indicate that there is a tradeoff between inductance and resistance. Wide elastic members, small number of loops, and a short radius produce low resistance but also lead to low inductance. The ratio between coil impedance and resistance, also called the coil quality factor Q, is a good parameter for assessing how losses influence coil performance:

$$Q = \frac{2\pi f L}{R} \quad (8)$$

This dimensionless parameter determines the sharpness of the resonance peaks of LC resonators, the selectivity of LC filters, the amount of oscillator jitter, and the gain of resonant amplifiers. Looking now again at equations 6 and 7, it can be seen that the quality factor increases with coil diameter and with the ratio between conductor width to the winding pitch:

$$Q \approx \frac{\pi f \mu_0}{\rho/\delta} \frac{w}{x} r \quad (9)$$

Also, the importance of a low AC sheet resistance, $\rho/\delta$, is explicitly expressed in equation 9.

Table 1 tabulates a few representative inductance values and Q factors for out-of-plane coils produced in accordance with the invention. A conductor resistivity of 2.5 $\mu\Omega$-cm is assumed in the estimates. The quality factors are roughly approximated by supposing that the current flows as a uniform sheet with a sheet thickness equal to the skin depth. The actual quality factor may be up to a factor of 2 smaller due to proximity effect that is not included in these calculations. The listed Q numbers should be compared to the best values of 10 to 20 that are currently obtained with state-of-the-art in-plane coils utilizing high aspect ratio windings and removed substrate.

TABLE 1

Matrix of Values for Typical Air-Cored Out-of-Plane Inductor Coils

| Line width [μm] | Line pitch [μm] | Coil diameter [μm] | Coil length [μm] | # turns | L [nH] | Q @ 1 GHz |
|---|---|---|---|---|---|---|
| 4 | 8 | 70 | 76 | 10 | 6.4 | 7.3 |
| 4 | 8 | 70 | 796 | 100 | 61 | 7.0 |
| 24 | 30 | 200 | 294 | 10 | 13 | 32 |
| 24 | 30 | 200 | 2994 | 100 | 132 | 32 |
| 54 | 60 | 500 | 594 | 10 | 41 | 90 |
| 54 | 60 | 500 | 5994 | 100 | 412 | 90 |
| 90 | 100 | 1000 | 990 | 10 | 100 | 180 |
| 90 | 100 | 1000 | 9990 | 100 | 988 | 180 |

Figure 40A:
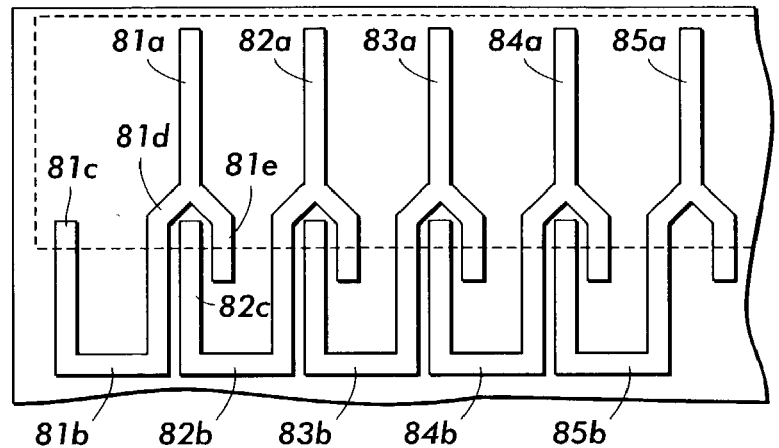
FIG. 40 illustrates a method of providing inter-coil connections.
Figure 40B:
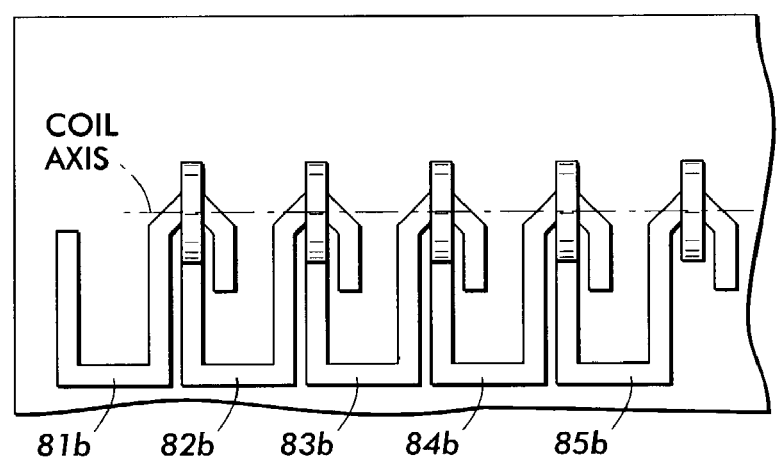

In addition to the "diagonal" release window for connecting individual loop windings to one another as described in FIG. 35, many other types of connections are possible. An alternate embodiment is shown in FIG. 40 which utilizes symmetric wedge take-off points. In FIG. 40, elastic members 81a–85a are deposited and patterned on a substrate. Each elastic member, for example, 81a, includes a patterned contact pad arrangement. This contact pad arrangement includes a U-shaped portion 81b, which includes two tip portions, 81c and 81d. Also included for support is symmetric element 81e. The symmetric supports balance opposing biaxial stresses in the released film 81a in order to reduce lateral bending of the coil windings. Placing the release point lower than a mating contact pad also brings the elastic member tip to the proper contact point without mechanical blocks. This design alternative enables better contacting at the expense of a slightly longer winding pitch. When elastic members 81a–85a are released, they coil and contact pad portions 82c–86c(not shown).

Figure 41:
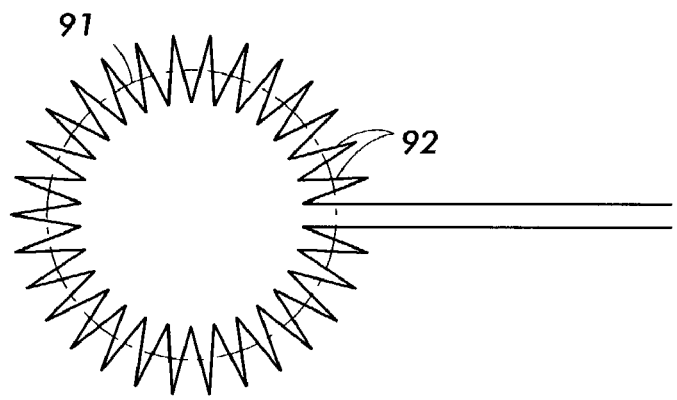
FIG. 41 illustrates a toroidal solenoid.

The multi-turn coil designs in FIGS. 35, 36, 39 and 40 provide linear coil arrangements, i.e., the coil axis is a straight line. Each of these designs can also be arranged in a circular layout to form micro-toroids, i.e., the coil axis is in a circle. A micro-spring toroid is shown in FIG. 41, with coil axis 91 and each coil turn 92 shown schematically. Toroids are attractive because they confine magnetic fields very tightly within their windings, thus allowing multiple coils to be packed very closely without mutual coupling. The absence of stray magnetic fields also further reduces lossy substrate eddy currents.

Figure 42:
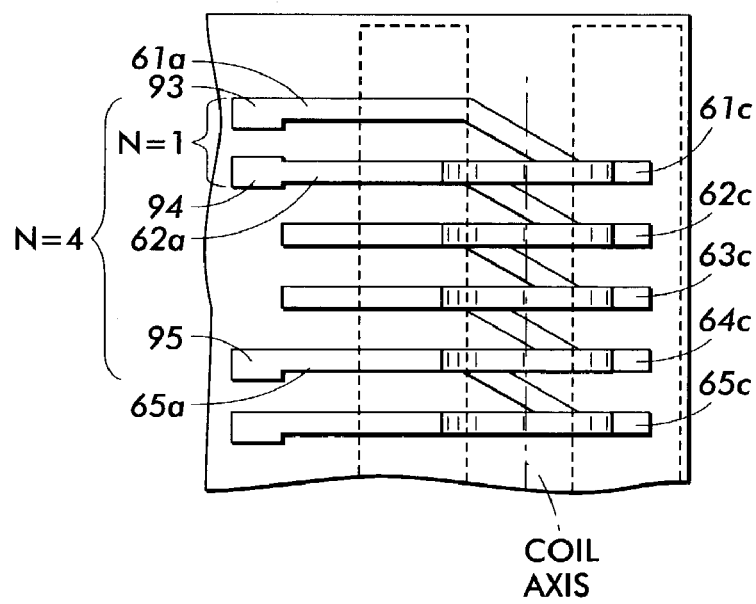
FIG. 42 illustrates coil tapping.

Unlike in-plane coils, the individual windings of out-of-plane coils are easily accessible at arbitrary locations along the inductor. Therefore, it is possible to obtain different inductances from a single coil by tapping the windings at appropriate locations. When combined with transistor switches, these taps can be used to make variable inductors useful in tunable filters and resonators. FIG. 42 shows how the coil of FIG. 41 can be modified by adding tap 93 at contact pad 61a, tap 94 at contact pad 62a and tap 95 at contact pad 65a. Note that the tap points depend on N, the number of windings between taps. Between taps 93 and 94, N=1 and between taps 93 and 95, N=4.

In addition to their use as inductors, the out-of-plane coils can be used as transformers. Micro-transformers are essential in electronic components such as mixers, double-tuned filters and RF signal transformers. The out-of-plane coils are compatible with a variety of micro-transformer architectures. FIG. 43 shows an embodiment in the form of a toroidal transformer with an air core, which includes primary winding 124 having input/output 122 and secondary winding 126 with input/output 120. The voltage relationship between the two coupled coils is determined by the ratio of turns between the primary and secondary windings. The pairs of arrows 120 and 122 indicate current paths into and out of the two windings, 124 and 126.

FIG. 44 shows an alternate design for an air-core transformer with intertwined primary 124 and secondary 126 windings. The multiple outbound arrows 127 in the secondary coil 126 illustrate the possibility of coil tapping for obtaining variable transformer ratios. The inset shows the micro-spring layout necessary for implementing the transformer architecture. Coil tapping is, naturally, also compatible with the device in FIG. 43.

Ferromagnetic cores are attractive for many coil applications because of their ability to increase coil inductance and to channel and confine magnetic fields to well defined regions. For high frequency GHz applications, however, any ferromagnetic material used has to be electrically insulating. Otherwise, excessive loss leading to low Q will result.

The micro-coils can be embedded in an epoxy matrix that contains ferrite particles, after they are released from the substrate. This creates a ferrite core in and around the micro-coil that increases the coil inductance. It is also the method of choice to confine the magnetic fields of solenoids. The field lines outside the solenoid do not fan out anymore because the ferrite around the coil closes the magnetic pathway.

Coils are magnetically isolated from each other by using an island of ferromagnetic material for each individual coil. Coil windings are therefore placed in deep pockets made by patterning spin-coated BCB or another thick film. After release of the elastic member, the pocket is filled with ferromagnetic particles of a suitable size immersed in an insulating epoxy matrix.

Another approach utilizes ferromagnetic metal cores that can be deposited and patterned in ways that are compatible with microfabrication. However, since these cores are conductive, their applications are limited to lower frequencies. FIG. 52 shows such a device employing an electroplated permalloy (NiFe) core. In this embodiment, a layer of $SiN_x$ 202 is deposited on the substrate 200, followed by the elastic member 204. A thick film 206, such as SU-8 photoresist, is first patterned to define a window for plating the core material. The NiFe core 208 is plated above a thin vacuum-deposited seed layer which in turn lies on top of an insulating dielectric 210. The SU-8 layer 206 is then removed, followed by release of elastic member 204 to form loops that enclose the core. The coil losses can be reduced to some extend by laminating the core 208 as shown in FIG. 52.

Figure 45A:
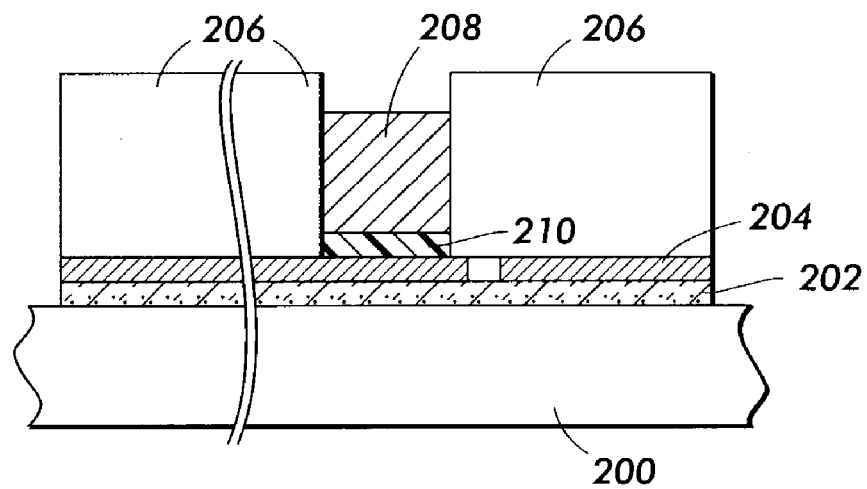
FIG. 45 illustrates an inductor with electroplated permalloy cores.
Figure 45B:
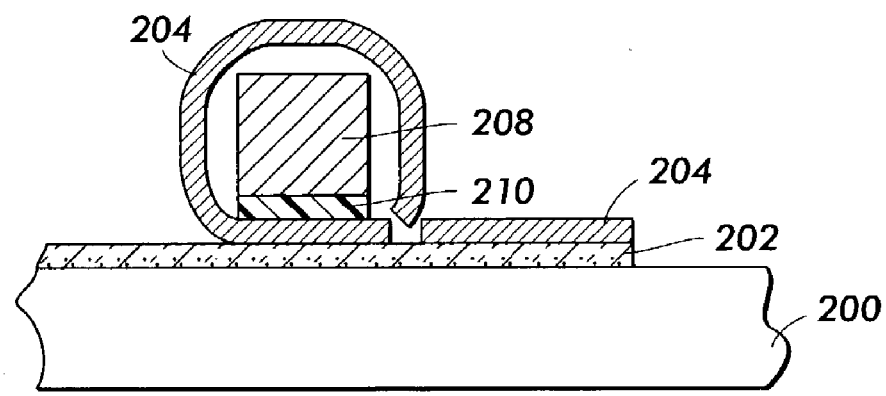
Figure 46A:
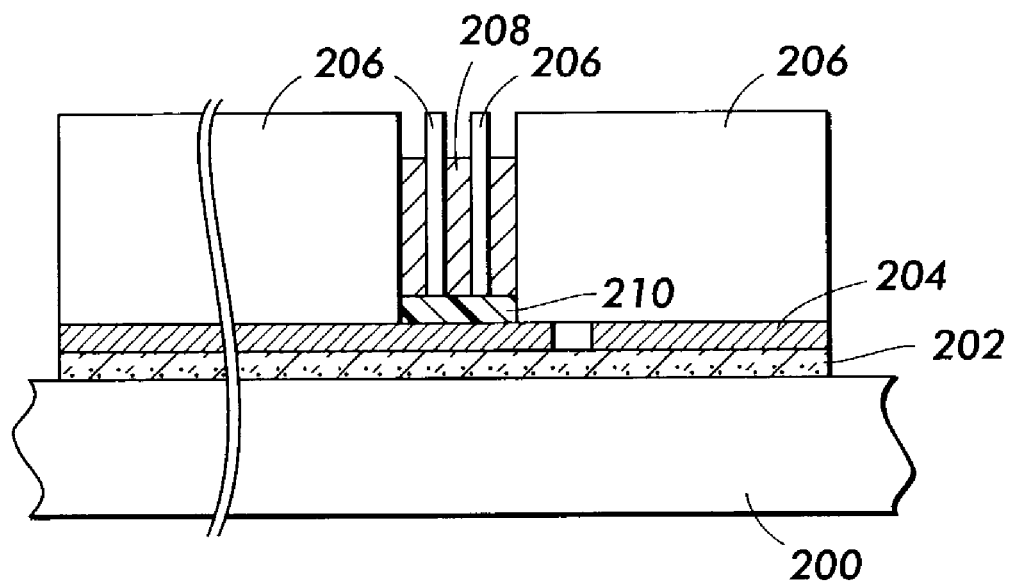
FIG. 46 illustrates laminating metallic cores.
Figure 46B:
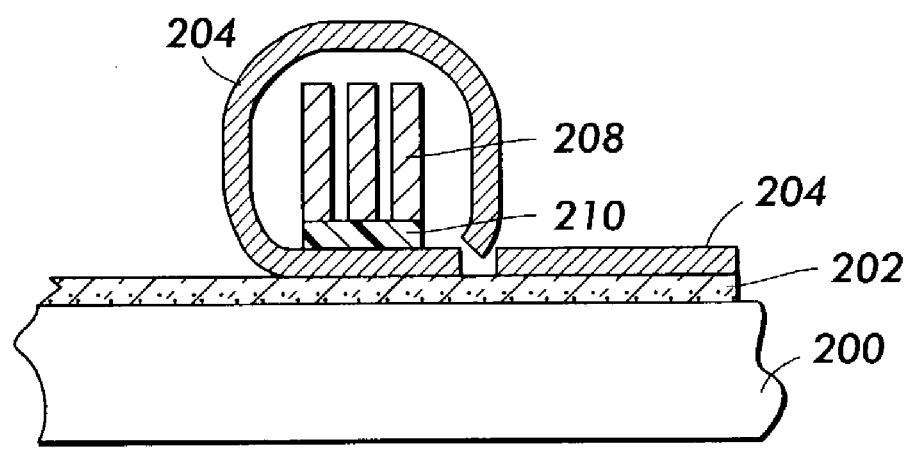
Figure 47A:
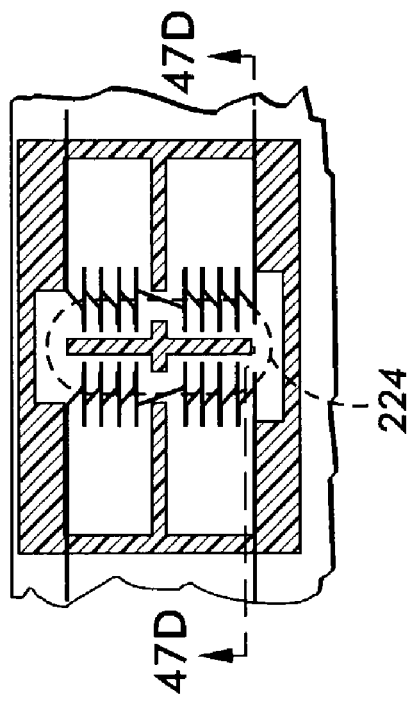
FIGS. 47a and 47b illustrate two stages of a microtransformer.
Figure 47B:
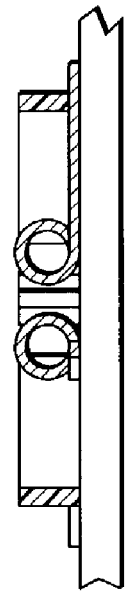
Figure 47C:
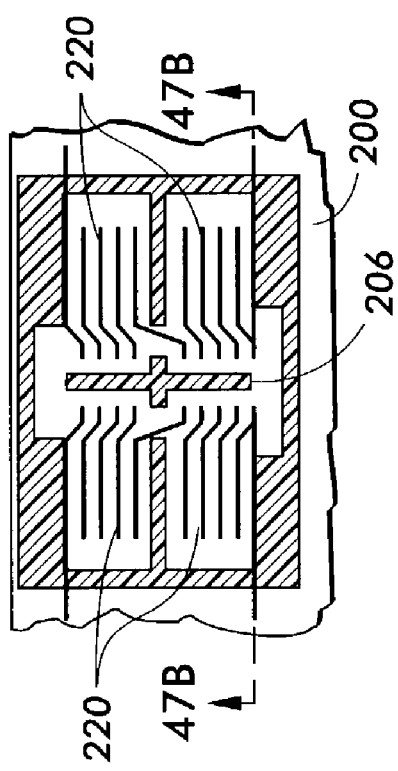
Figure 47D:
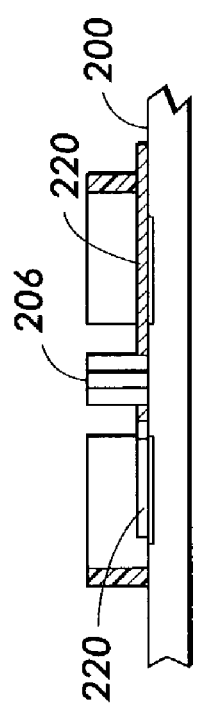

FIGS. 45 and 46 are not drawn using actual scale and aspect ratios. In particular, the core 208 has to be designed so that it conforms to the constraints discussed in FIG. 38. This constraint makes the core occupy much less than the available cross sectional area of the coil. However, for typical core relative permeability of about 1000, even a 10% fill factor will increase the inductance of an air-core device by about 100-fold.

A metallic or ceramic ferromagnetic core can also be formed by physically attaching a pre-made core 206 on the substrate 200 prior to release of the elastic members 220 as shown in FIG. 47. The placement can be performed by an automatic pick and place equipment commonly used in the chip industry. The dimensions of the pre-made core will, naturally, also have to conform to the same constrains discussed in FIG. 38.

FIG. 47 illustrates how a ferromagnetic core micro-transformer can be fabricated using the methods described above. FIG. 47a shows the elastic member 220 layout prior to release. Two sets of metal lines facing opposite each other for the primary and secondary windings are placed within the BCB pocket. After release of the elastic members 220, the pocket is filled with a ferromagnetic epoxy. An illustration of the released elastic members is shown in FIG. 47b. The loop 224 in FIG. 47b traces a magnetic path coupling the primary and secondary coils. The pocket is designed with features that extend towards the coil axis midway down each coil. These features are meant to obstruct stray fields and improve the intended coupling between the primary and secondary windings. Although the estimated coupling for the transformer in FIG. 47 is only about 66%, significant improvements are possible if photo-definable filling materials are used.

An alternative ferromagnetic core micro-transformer can be fabricated from the methods discussed in FIGS. 45 and 46. In this embodiment, the core of FIGS. 51 and 52 is fashioned in a loop that magnetically couples a set of two or more coil windings. To reduce the possibility of core saturation, a small air gap can be placed to break the core loop.

The above described coil structures have circular loop windings. Such coil structures can also be manufactured using coils with a helical twist.

It has been observed that a helical twist develops in some released structures. The origin of this twist is stress anisotropy. Specifically, in a planetary deposition system, the radial and tangential components of the stress in the film vary at different rates, producing stresses of differing magnitude. The stress anisotropy gives rise to a radial-tangential shear. The pressure in the sputter system is varied during deposition to produce a stress gradient, however, because the stress is anisotropic, a shear gradient develops as well. This applies a torque to the spring, giving it a finite helical pitch. The helical pitch causes the tip of the released spring to move off the axis of the spring.

It has also been observed that wider finger structures tend to lift more than narrow finger structures of the same thickness. Springs can twist in only one direction at a time, and so cannot relax stress completely in one direction. As plane strain conditions exist near the longitudinal centerline of wider springs, intrinsic longitudinal stresses relax completely, while transverse stresses can only relax very near the edges.

FIG. 48 illustrates how different helical pitch results from varied spring orientation. The springs were made from metal deposited in a planetary sputter system. The planetary motion of the wafer in the vacuum system produces geometric differences in the flux arrival in the radial and tangential directions of the wafer. This causes the stress in the radial and tangential directions of the wafer to be unequal. Two loops are shown, the one to the left 130 is oriented along a direction of principle stress, and as a result, the helical bending is practically zero. The spring on the right 132 in FIG. 48 is oriented at 45 degrees to the principle axis, and as a result has a large helical pitch, on the order of the loop diameter. Therefore, by taking a metal film of known stress anisotropy, in this case about 8.6%, and by orienting the spring at the desired angle to the principle axis, the pitch may be usefully controlled.

Inventor David Fork's co-pending application D/A0505 (IP/A00002) which is filed the same day as this application and is incorporated herein by reference discloses manufacturing methods for sputtering thin films with controlled stress anisotropy. Other methods for creating a helical twist in the loop winding are disclosed below.

FIG. 49 illustrates how a multi-turn coil 140 utilizing single helical turns 142 might be configured on a substrate. Each turn of the coil has a sufficient degree of helical pitch to jog the free end of the loop over to a contact pad 144 adjacent to the loop 142. The free end in making mechanical contact with the pad may also make electrical contact.

Robust electrical and mechanical contact can be improved by for example soldering the free end of the loop to the pad 143. The illustration in FIG. 49 shows a jog between the end of the first loop and the base of the adjacent loop. This is done for clarity, and is not necessary for the actual device. The performance is better for coils with denser windings, therefore it is advantageous to pack the coils as tightly as possible.

FIG. 50 shows a multi-turn coil 150. For such a coil, the spring metal is patterned into a strip that is long enough to span the entire coil. The illustration shows 4 turns. In principle, the number of turns is limited by the length of the substrate, since the length of the spring is given by the product of the number of turns and the loop circumference. If it is not practical to make a single inductor out of a single multi-turn coil, multi-turn segments could be joined using the pad contact points shown in FIG. 34 to produce a complete device.

One possibility with a multi-turn loop segment of FIG. 50 is to produce more densely wound coils. For coils produced from loops of single turns, layout considerations limit the loop spacing to be at least slightly greater than the width of the spring metal in the loop. Multi-turn loops however do not have this restriction, because the springs are made longer in the transverse coil direction to accommodate the multiple turns. A long strip of metal can coil with a helical pitch less than its width, and the free end can overlap a contact pad either via the cumulative offset of the helical pitch, or by a tab the extends from the free end of the spring to the pad. To prevent shorting of the overlapping turns of the multi-turn loop, one surface, preferably, the top surface of the spring metal can be covered or partially covered with an insulating spacer layer. This technique may require tighter control of the radius and pitch since error in free end placement would accumulate with each turn.

Other methods can be used to displace the free end of the elastic member with respect to the takeoff point. Varying the radius of curvature of the coil will displace the free end in a transverse direction. The radius of curvature depends on the amount of intrinsic stress profile in the elastic member and on the mechanical properties of the elastic member. To obtain a desired twist, an elastic member can be formed with an intrinsic stress profile of one value in a first portion and a second value of intrinsic stress profile in the remaining portion. Another method is to put in anisotropic properties by, for example, depositing a load layer on one side of the elastic member. When the elastic member is released, the resulting coil will have two sections, each with a different radius of curvature. The effect of the two different radii of curvature is that it forces the elastic member to twist.

While a coil with sections having two different radii of curvature can be employed to offset the landing position of the tip from the takeoff point of the released elastic member, a preferred configuration is one with three sections of different radii of curvature. FIG. 51 shows a plot of a roughly 0.5 mm diameter loop wherein the elastic member was designed to contact tangentially to a point roughly 150 microns behind the take-off point of the elastic member. The top half of the coil is composed of a larger radius than the bottom half. This has the effect of displacing the free end backward with respect to the take-off point. Second, by making the bottom (first and fourth) quarters (first and third segments) of the spring have a smaller radius than the top segment, the free end of the spring contacts the substrate tangentially. Tangential contact may be advantageous for increasing the area of contact, and thereby lowering the contact resistance. Tangential contact may also reduce the sensitivity to placement errors. Note that the radii for the first and third segments are equal, there is no need to create more than two different radii; this simplifies processing.

Another way to vary the radius of curvature is by incorporating a load layer on either the inner surface of the elastic member or the outer surface (or both). The load layer is an additional layer patterned on the elastic member to apply stress that either increases or decreases the bending radius. The bending radius, R, for a loaded beam can be expressed as $$R = \frac{Y_o^2 h^4 + 2Y_o Y_1 ht(2h^2 + 3ht + 2t^2) + Y_1^2 t^4}{\Delta \delta h^2 (hY_o + tY_1) + 6(\sigma_1 Y_o - \sigma_o Y_1) ht(t + h)} \quad (10)$$

where $Y_0$ is the spring modulus, $Y_1$ is the load layer modulus, h is the spring thickness, t is the load layer thickness, $\Delta \sigma$ is the spring intrinsic stress variation, $\sigma_0$ is the net intrinsic stress in the elastic member, and $\sigma_1$ is the load layer intrinsic stress.

In the example in FIG. 51, the two radii for the first and second segments could be produced with the following parameters:

| Elastic Member | Nickel alloy |
| --- | --- |
| Member Stress Gradient | 1 GPa |
| Member Net Stress | 0 GPa |
| Member Thickness | 970 nm |
| Load Metal | Gold |
| Load Stress | 0 GPa |
| Load Thickness | 180 nm |

The load layer is patterned to reside only on the middle segment of the elastic member. Note that the equation 10 assumes purely elastic behavior, and may be approximate. Gold may relieve some of its stress by plastic flow. This may modify the thickness required somewhat. Other materials, with higher yield points can be substituted for gold as the load materials.

FIG. 52 shows a coil produced with a tangential offset by incorporation of a load layer. The structure of FIG. 52 may be produced in accordance with the following process. First, a release layer 301 of 100 nm Ti is deposited on a substrate (not shown). Next the outer coil conductance layer 302 (which is preferably gold, but may be any other suitable conductor) is deposited. Then the elastic member material 303, which is NiZr, is deposited on the conductor layer 302. A load layer 304, which is preferably a metal layer of gold, is then deposited on the elastic member. The location of the solder pads are then masked with photoresist, followed by plating of solder onto the solder pad areas. The solder pad mask is then stripped and the load layer is then masked with photoresist. This provides the location of the load layer. The load layer is then etched with potassium iodide and the load layer mask is stripped. Next the elastic member is masked with photoresist. The elastic member 303 is then etched with nitric acid to form the unreleased coil. Then the coil conductance layer 302 is etched with potassium iodide. To clear between the elastic members, the release layer 301 is etched, preferably by dry etching in a fluorine plasma. The elastic member mask is stripped and then the release window is masked with photoresist. The release layer is removed through the release window using hydrofluoric acid. If desired, the release window mask can be stripped. When the release layer is removed, the intrinsic stress profile in the elastic member 302 causes the elastic member to coil on itself. The load layer 304 causes a tangential offset, which enables contact with a contact pad. Flux is applied to the solder contacts, the solder reflows. Preferably an epoxy is applied over the resulting coil and cured. Finally the wafer is diced.

The resulting coil structure in FIG. 52 illustrates that it is possible to create a useful coil-closing structure with as few as two segments. FIG. 53 illustrates a top view of a completed transversely joined single turn loops.

The radius of curvature of the coil segment can be varied by placing a load layer asymmetrically across a segment of the elastic member or by introducing one or more openings asymmetrically in the elastic member prior to release. We have observed a size effect for the bending of the spring, which arises because the edges of the spring are able to relax some of the intrinsic stress. Narrower springs relax more of the total stress at their edges than wide springs. For springs of varied width, or slotted springs, a theory has been worked out. Essentially, the effective biaxial modulus of the spring can be varied between the limits defined by $Y/(1-v)$ and $Y/(1-v^2)$, where Y and v are the Young's modulus and Poisson ratio respectively. For typical values of v the radius can be varied by about 30% by slotting the spring, or varying its width. A similar effect is possible by placing holes (openings 162 in elastic member 160 as shown in FIG. 54a) rather than slots (slot 172 in elastic member 170 as shown in FIG. 54b) into the elastic member; this would produce two dimensional stress relaxation. This effect can be exploited by perforating the top segment of the elastic member in order to make it bend to a larger radius. For practical reasons, it is better to slot the elastic member into as few strips as needed in the top segment in order to maximize the conductance.

Advantages of perforation are that it removes the need to separately deposit, mask, and pattern an additional layer, such as a load layer. The process is therefore less expensive. A further advantage is that it alleviates the need to control the materials properties of the load layer, thus simplifying the process, and increasing yield. The example spring shown in FIG. 51 could have been created by slotting the middle segment of a MoCr spring with a thickness of 1.75 microns and an intrinsic stress profile of 2.8 GPa.

A further application of perforation is to produce a controlled helical pitch, not by growing in an intrinsic stress anisotropy as described above, but by instead slotting the elastic member to produce a net torque. A slot 172 running down the length of a segment of the elastic member 170, and offset to one side, will cause the two sides of the segment to bend to different radii. This will pull the segment into a helix. Other asymmetric configurations may also have utility, such as diagonal slots or load layers, or off-center holes or load layers. A variable radius coil would also allow higher fill factors for NiFe cores by relaxing the constraints of FIG. 38.

A significant challenge to making a useful coil is making the coil resistance low (high Q factor). An aspect of the micro-coils described above is that high Q inductors may be created by adjusting the spring width, and outer conductor resistivity, and the outer conductor thickness. Because the skin effect confines the current to the outer surface of the coil, these factors dominate the high frequency resistance of the inductor loop.

The resistance of the loop closure may also be limited by connecting the free end of a loop back to a contact pad on the substrate with low resistance. Obtaining low resistance at the contact pad requires a good metallurgical junction consisting of highly conducting materials. Below we describe a structure and manufacturing embodiment that achieves metallurgical junctions with low contact resistance. Coil structures incorporating a solder pad that is reflowed to close the loop has been described above and achieves a good metallurgical junction as well low contact resistance. Alternatively, the free end may be joined to the contact pad by plating, either electroless or electroplating. In this method, the loop is formed by releasing the elastic member. The free end comes into either mechanical contact or proximity to a contact pad on the inductor substrate. Then, plating applies conducting material around both the free end and the contact pad, forming a continuous joint between them. In this embodiment, the application of material need not be limited to the free and the pad areas only. Preferably, the plated material has high conductivity, and is plated throughout the loop in order to reduce the coil resistance, thereby beneficially increasing the quality factor.

The method of the invention permits process extensions. These process flows are exemplary, but other variations are possible. For example, certain process steps described above with respect to FIG. 52 may be combined or eliminated. Layers of solder used to close the loop, could also serve as the release window for the spring release step.

The foregoing techniques can also be used to manufacture a new type of high-Q varicaps. These varicaps use the same microspring technology described above, have the requisite capacitance values, and can be integrated on chip. A varicap structure based on micro-springs allows both missing on-chip RF passive components, inductors and varicaps, to be fabricated using the same process technology. These microspring varicaps have the additional benefit of requiring lower bias voltages than parallel plate MEMS capacitors. By using a spring as the second electrode in a photolithographically patterned capacitor, and varying the voltage between a fixed plate and the spring, the capacitance of the structure varies.

FIG. 55 shows a cross-section of a variable capacitor employing the micro-spring technology. A layer of metal 153 (metal 0) is first deposited and patterned to the desired shape on a substrate (not shown). Next a layer of a dielectric material 156 is deposited and patterned over the metal layer 153. Over the dielectric layer 156, a release layer 152 is deposited. Then metal layer 151 (metal 1) is deposited over the release layer 152. Metal layer 151 is an elastic material with an inherent stress profile built in. This inherent stress profile is built into the layer in the same manner as described above with respect to the micro-springs. Metal layer 151 is patterned to the desired spring shape. When the release layer 152 is patterned and partially removed, the inherent stress profile in the metal layer 151 biases the free portion of metal layer 151 away from dielectric layer 156 covering the metal layer. If an insulating material is used for the release layer 152, the dielectric layer 156 may not be necessary.

The capacitance is defined by a suspended undercut section of length $L_1$ in parallel with a fixed portion of length $L_0$. If a DC bias is applied between layer 153 and layer 151, electrostatic forces will cause the suspended part to bend down and increase the AC capacitance.

FIG. 56 plots the capacitance as a function of the spring lift, d, for the specific case of $L_0=25$ $\mu$m, $L_1=100$ $\mu$m, $d_0=0.5$ $\mu$m, capacitor width=500 $\mu$m, and r=500 $\mu$m. In a VCO circuit, the spring radius of curvature, r, could be designed so that it is identical to the loop radius of the accompanying inductor. This way both inductors and varicaps can be fabricated in the same step.

FIG. 56 shows that the varicap capacitance changes from 2 pF to 2.2 pF when the tip is deflected from 10 μm to 7 μm. This 10% tuning range corresponds to a deflection that is well below ⅔ of the initial lift, so there is no danger of bi-stable operation where the spring suddenly snaps down. The estimated voltage required to deflect the cantilever by 3 μm is only about 10V. This low voltage is due to the curved electrode profile, which generally requires lower drive voltages than more conventional actuators. For larger deflections, one can consider tapering the spring tip to delay the onset of bi-stable behavior. Alternatively, one can make a tapered electrode (layer 151 in FIG. 55) under a conventional spring.

Varicaps made according to the above processes exhibit excellent immunity to vibration. The curved electrode profile allows the cantilever to be made stiffer than in parallel plate devices resulting in devices with low sensitivity to inertial forces. Under acceleration, the ratio of inertial forces to electrostatic forces is only in the order $10^5$.

Figure 57:
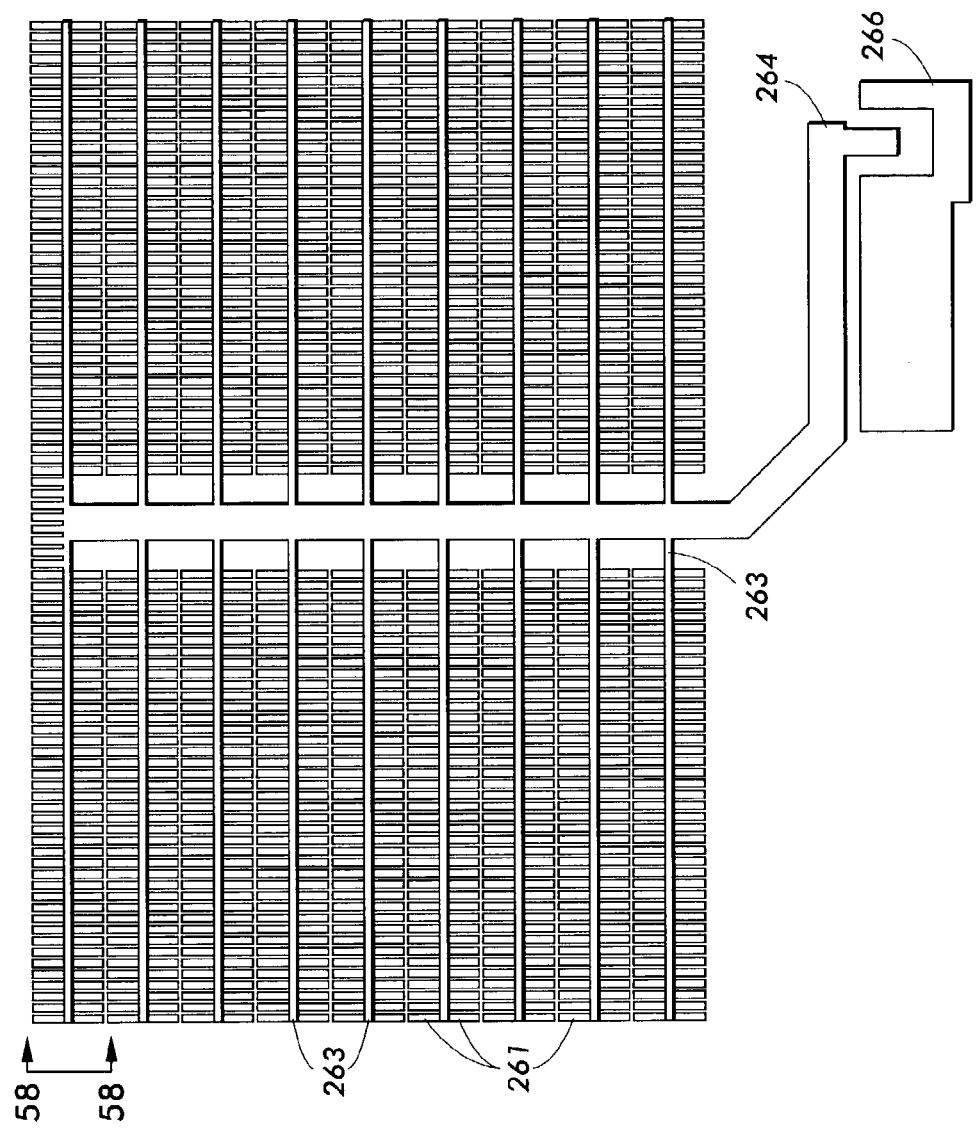
FIG. 57 is a top view of a varicap having a large array of individual capacitor elements.

An array of variable capacitors can be arranged into a single device to produce a larger capacitance. FIG. 57 shows an example of a larger variable capacitor. Referring to FIG. 57 and detail FIG. 58, a large bottom conductor layer 268 is deposited on a substrate 269. Contact 266 provides the contact for the bottom electrode, which may be multiple electrodes connected electrically together or a single bottom conductor layer. A dielectric layer 267 is deposited on top of conductor 269 followed by a release layer 270. On top of the release layer 270 is deposited the second conductor layer 261, which is patterned into the configuration of parallel rows of "springs" 261, each connected electrically by a bus connector 263. The height of the micro-springs 261, determines the capacitance, and is controlled by applying a voltage between the springs contact 264 and the contact for the bottom electrodes 266. In some embodiments, if the release layer 270 is formed of an electrically insulating material, the portion of the release layer remaining beneath the first conducting layer 261 functions as the dielectric layer. This eliminates the need for depositing a separate dielectric layer. However, in most applications, it is preferred to have the dielectric layer 267 extend completely between the first and second conducting layers to prevent shorting.

The method of the invention can be easily applied for on-chip circuit applications requiring an LC circuit or a tunable LC circuit. Referring to FIGS. 59 and 60, a tunable LC circuit is shown. The microcoil 270 connects a tunable capacitor 272 formed by plates 284(A), and 282(B), with common dielectric layer 286(D). Applying a DC bias between plates 284(A) and 282(B) controls the value of the capacitance. A DC blocking capacitor formed by plates 280(C) and 282(B) prevents the microcoil from shorting the bias source. Note how the microcoil 270 attaches to the DC blocking capacitor at point 290. The capacitor top plates 284(A) and 280(C) are implemented preferably using the same metal as for the microcoil 270. The bottom plate 282(B) is made of an additional metal layer.

Processing is achieved economically. First the bottom conductor layer D(286) is deposited on the substrate and etched. Then the dielectric layer 286 is deposited followed by a single release layer (not shown) which covers the area of both capacitor BC and microcoil 270. A metal layer C is deposited. Then a metal layer formed of an elastic material for both capacitor layer A and microcoil 270 is deposited and shaped. When the release layer is undercut, the microcoil and variable plate A are formed. The free ends of the microcoil are attached using one of the methods describe above.

EXAMPLE: Varicap AB with a tuning range of 500 μm by 550 μm variable capacitor, 500 nm $Si_3N_4$ dielectric ($\epsilon_r$=8) =3.5 to 22.7 pF with a minimum overlap=500 μm by 50 μm, maximum overlap at the snap-down limit=500 μm by 320 μm. At this point the tip of plate A is down by 66%.). Blocking capacitor DC of size 400 μm by 1.6 mm, 500 nm $Si_3N_4$ dielectric layer ($\epsilon_r$=8)=91 pF. The tuning range of both capacitors in series=3.37 to 18.2 pF. The Micro-solenoid 270 has a 1 mm diameter, 5 windings, 500 μm long=26 nH. As a result, the tuning range of the LC resonance frequency=538 to 232 MHz.

The invention provides a new type of high Q micro-inductors that can be integrated on Silicon ICs. Unlike most previous micro-coils, the coil structures feature an out-of-plane architecture where the coil axis is placed parallel to the wafer surface. The out-of-plane coils address the problem of induced substrate eddy currents associated with in-plane inductors. It also provides a simple way to counter the increased electrical resistance caused by skin effects without resorting to high aspect ratio processing. The design is compatible with a large variety of related embodiments such as coil tapping and transformers. This invention supplies a major missing element in integrated RF circuit design.

A new type of high Q micro-spring variable capacitors and out-of-plane inductors that can be integrated on Silicon ICs has been described. These varicaps when combined with inductors can be implemented for on-chip integration of entire VCOs in superheterodyne circuits. While the invention has been described with reference to specific embodiments, the description of the specific embodiments is illustrative only and is not to be construed as limiting the scope of the invention. Various other modifications and changes may occur to those skilled in the art without departing from the spirit and scope of the invention.

What is claimed is:

1. A method for forming an out-of-plane coil structure, comprising:
    depositing a layer of an elastic material on a substrate, the elastic material having an intrinsic stress profile;
    photolithographically patterning the layer of elastic material into an elastic member, and
    under-cut etching a portion of the substrate under the elastic member to release a free portion of the elastic member from the substrate, an anchor portion of the elastic member remaining fixed to the substrate;
    wherein the intrinsic stress profile in the elastic member biases the free portion of the coil structure away from the substrate, forming a loop winding and causing a free end to contact a point on the substrate; and
    connecting the free end to the substrate.

2. The method of claim 1, wherein the free end contacts a point on the substrate other than its release point.

3. The method of claim 1, wherein the elastic member is formed of an electrically conductive material.

4. The method of claim 1, further comprising;
    after photolithographically patterning the lever of elastic material into an elastic member; forming a mechanical stop at a point on the substrate for positioning return of the free end.

5. The method of claim 1, wherein the free end is connected at a point on the substrate which is offset opposite from the anchor portion.

6. The method of claim 1, wherein the step of depositing an elastic layer further includes depositing at least one of a layer of an electrically conductive material and a layer of an elastic material having an intrinsic stress profile; and depositing the other layer.

7. The method of claim 1, wherein the intrinsic stress profile along the layer of the elastic material varies with distance from the anchor point to the free end, wherein the radius of curvature of the coil structure varies as a function of distance from the anchor point.

8. The method of claim 1, wherein the intrinsic stress profile along a first portion of the coil structure is greater than the intrinsic stress profile along a second portion of the coil structure, wherein the radius of curvature of the coil structure along the first portion is less than the radius of curvature along the second portion.

9. The method of claim 1, wherein the step of under-cut etching comprises the step of:

photolithographically patterning a release window around the free end of the elastic member, and applying an etchant formulated to etch the substrate under the elastic member, the free portion of the elastic member being released from the substrate.

10. The method of claim 9, wherein the step of depositing the layer of the elastic material comprises: sputter depositing a plurality of sub-layers of a metal alloy, each of the plurality of sub-layers deposited at a different selected plasma gas pressure, each different selected plasma gas pressure creating a corresponding different level of intrinsic stress in a corresponding one of the plurality of sub-layers.

11. The method of claim 10, wherein a bottom-most sub-layer has an intrinsic compressive stress, and sub-layers above the bottom-most sub-layer have increasing intrinsic tensile stress relative to the bottom-most sub-layer.

* * * * *